(12) United States Patent
Chen et al.

(10) Patent No.: US 10,657,216 B2
(45) Date of Patent: May 19, 2020

(54) ROUTERLESS NETWORKS-ON-CHIP

(71) Applicant: Oregon State University, Corvallis, OR (US)

(72) Inventors: Lizhong Chen, Portland, OR (US); Fawaz M. Alazemi, Corvallis, OR (US); Bella Bose, Corvallis, OR (US)

(73) Assignee: Oregon State University, Corvallis, OR (US)

( * ) Notice: Subject to any disclaimer, the term of this patent is extended or adjusted under 35 U.S.C. 154(b) by 319 days.

(21) Appl. No.: 15/445,736

(22) Filed: Feb. 28, 2017

(65) Prior Publication Data

US 2017/0250926 A1 Aug. 31, 2017

Related U.S. Application Data

(60) Provisional application No. 62/301,451, filed on Feb. 29, 2016.

(51) Int. Cl.
*G06F 17/50* (2006.01)
*H04L 12/933* (2013.01)
*H04L 12/861* (2013.01)

(52) U.S. Cl.
CPC ........ *G06F 17/5077* (2013.01); *H04L 49/109* (2013.01); *H04L 49/9031* (2013.01); *H04L 49/9047* (2013.01); *H04L 49/9089* (2013.01)

(58) Field of Classification Search
CPC ............. G06F 17/5077; H04L 49/9089; H04L 49/9047; H04L 49/9031; H04L 49/40; H04L 49/109
See application file for complete search history.

(56) References Cited

U.S. PATENT DOCUMENTS

| | | | | |
|---|---|---|---|---|
| 7,692,448 B2 * | 4/2010 | Solomon | ............. | G06F 17/5054 326/38 |
| 8,042,087 B2 * | 10/2011 | Murali | ................ | G06F 17/5045 370/235 |
| 8,340,517 B2 * | 12/2012 | Shacham | ............... | H04B 10/25 398/46 |
| 9,009,648 B2 * | 4/2015 | Kumar | .................... | H04L 47/12 716/138 |
| 9,111,151 B2 * | 8/2015 | Chen | ................... | G06F 15/7825 |

(Continued)

OTHER PUBLICATIONS

Barroso et al., "Cache Coherence on a Slotted Ring," *Intl Conf. on Parallel Processing*, 8 pp. (Jan. 1991).
Bux et al., "An Approximate Method for the Performance Analysis of Buffer Insertion Rings," *IEEE Trans. on Communications*, vol. COM-31, No. 1, pp. 50-55 (Jan. 1983).
Das et al., "Catnap: Energy Proportional Multiple Network-on-Chip," *Int'l Symp. on Computer Architecture*, pp. 320-331 (Jun. 2013).

(Continued)

*Primary Examiner* — Naum Levin
(74) *Attorney, Agent, or Firm* — Klarquist Sparkman, LLP

(57) ABSTRACT

The disclosed technology concerns methods, apparatus, and systems for designing and generating networks-on-chip ("NoCs"), as well as to hardware architectures for implementing such NoCs. The disclosed NoCs can be used, for instance, to interconnect cores of a chip multiprocessor (aka a "multi-core processor"). In one example implementation, a wire-based routerless NoC design is disclosed that uses deterministically specified wire loops to connect the cores of the chip multiprocessor. The disclosed technology also comprises network interface architectures for use in an NoC. For example, a core can be equipped with a low-area-cost interface that is deadlock-free, uses buffering sharing, and provides low latency.

11 Claims, 21 Drawing Sheets

(56) References Cited

U.S. PATENT DOCUMENTS

| | | | |
|---|---|---|---|
| 9,134,778 B2* | 9/2015 | Kuesel | G06F 1/26 |
| 9,244,880 B2* | 1/2016 | Philip | G06F 15/17312 |
| 9,443,561 B1* | 9/2016 | Roberts | G11C 5/02 |
| 9,600,440 B2* | 3/2017 | Lih | H04L 12/437 |
| 9,619,006 B2* | 4/2017 | Samih | H04L 45/06 |
| 9,785,732 B2* | 10/2017 | Pusuluri | G06F 17/5077 |
| 9,825,779 B2* | 11/2017 | van Ruymbeke | H04L 12/56 |
| 9,852,254 B2* | 12/2017 | Janac | G06F 17/5072 |
| 9,876,708 B2* | 1/2018 | Pande | H04L 45/122 |
| 10,050,843 B2* | 8/2018 | Raponi | H04L 41/145 |
| 10,268,794 B2* | 4/2019 | de Lescure | G06F 17/5072 |
| 2011/0185331 A1* | 7/2011 | Baviskar | G06F 17/5068 |
| | | | 716/133 |
| 2012/0002675 A1 | 1/2012 | Kauschke et al. | |

OTHER PUBLICATIONS

Fallin et al., "A High-Performance Hierarchical Ring On-Chip Interconnect with Low-Cost Routers," SAFARI Technical Report No. 2011-007, 22 pp. (Sep. 2011).

Kumar et al., "Express Virtual Channels: Towards the Ideal Interconnection Fabric," *ISCA*, pp. 150-161 (Jun. 2007).

Liu, "Adaptive Computing based on FPGA Run-time Reconfigurability," Royal Institute of Technology, Ph.D. Thesis, 185 pp. (Apr. 2011).

Liu et al., "IMR: High-Performance Low-Cost Multi-Ring NoCs," *IEEE Trans. on Parallel and Distributed Systems*, vol. 27, No. 6, pp. 1700-1712 (Jun. 2016).

The On-Line Encyclopedia of Integer Sequences, "A140517—Number of cycles in an n×n grid," 1 p. (downloaded on May 3, 2017).

* cited by examiner

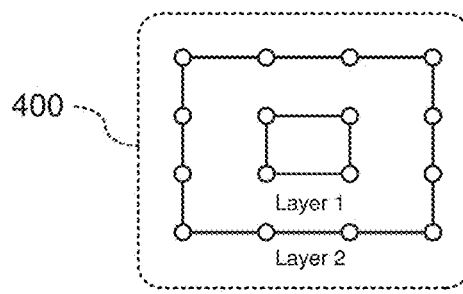
FIG. 4A
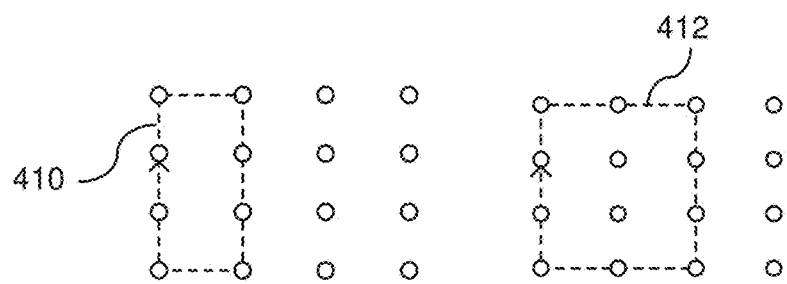
FIG. 4B  FIG. 4C
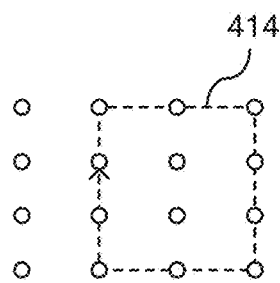 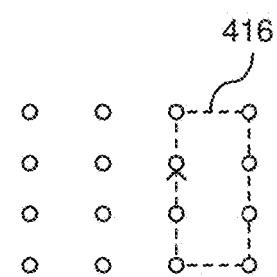 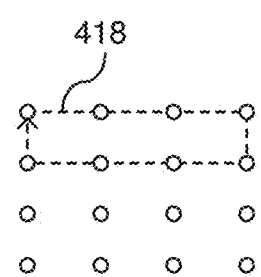
FIG. 4D  FIG. 4E  FIG. 4F
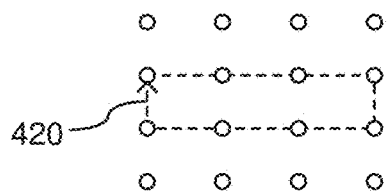 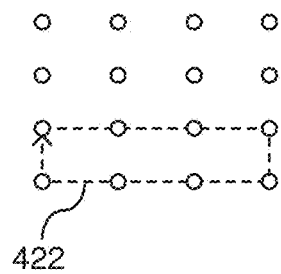 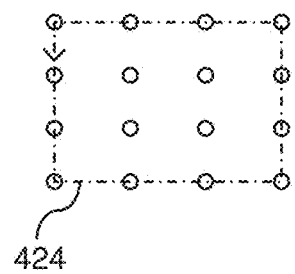
FIG. 4G  FIG. 4H  FIG. 4I

700

---
Algorithm 1: RLrec
---
    Input : L, H; the low and high numbers
    Output: $M$; set of circles
1 begin
2     if $L = H$ then
3        return { }
4     Let $M = \{\}$
5     if $H - L = 1$ then
6        $M = M \cup C(L, H, L, H, \text{clockwise})$
7        $M = M \cup C(L, H, L, H, \text{anticlockwise})$
8        return $M$
9     $M = M \cup C(L, H, L, H, \text{anticlockwise})$
10    for $i = L+1 \rightarrow H-1$ do
11       $M = M \cup C(L, H, L, i, \text{clockwise})$
12       $M = M \cup C(L, H, i, H, \text{clockwise})$
13    for $i = L \rightarrow H-1$ do
14       $M = M \cup C(i, i+1, L, H, \text{clockwise})$
15    $M' = \text{RLrec}(L+1, H-1)$
16    Reverse and rotate for 90° every circle in $M'$ and add them to $M''$
17    return $M \cup M''$

FIG. 7

ROUTERLESS NETWORKS-ON-CHIP

CROSS-REFERENCE TO RELATED APPLICATIONS

This application claims the benefit of U.S. Provisional Application No. 62/301,451, entitled "LOW-LATENCY ROUTERLESS NETWORK-ON-CHIP DESIGN" and filed on Feb. 29, 2016, which is hereby incorporated herein by reference.

FIELD

This application concerns networks-on-chip ("NoCs") that are used to interconnect cores of a chip multiprocessor.

SUMMARY

The disclosed technology concerns methods, apparatus, and systems for designing and generating networks-on-chip ("NoCs"), as well as to hardware architectures for implementing such NoCs. The disclosed NoCs can be used, for instance, to interconnect cores of a chip multiprocessor (also referred to as a "multi-core processor"). The disclosed methods, apparatus, and systems should not be construed as limiting in any way. Instead, the present disclosure is directed toward all novel and nonobvious features and aspects of the various disclosed embodiments, alone or in various combinations and subcombinations with one another.

In general, an NoC connects multiple cores of a chip-multiprocessor ("CMP") (also referred to as a "multi-core processor"). The efficiency of NoCs can greatly affect the performance and cost of a CMP. An NoC may use on-chip routers, but such routers demand high power consumption and area.

In this disclosure, architectures that, among other things, reduce or eliminate routers from the design are disclosed. For instance, in one example implementation, a routerless ("RL") NoC design is disclosed that is wire-based (e.g., solely wire-based). For instance, by utilizing wiring resources of an NoC effectively, one can form multiple circular paths (e.g., wiring paths that form a loop and that typically have a rectangular shape) to interconnect cores (e.g., all cores) on a CMP without routers. Also disclosed herein are memory- and resource-efficient techniques for identifying and/or specifying the circular paths. For instance, one such technique is a fast, efficient recursive algorithm where every pair of cores shares at least one circular path.

The disclosed technology also comprises network interface architectures for use in an NoC. For example, a core can be equipped with a low-area-cost interface that provides low latency (e.g., 1 cycle per hop latency). Further, in some cases, the circular paths (e.g., all circular paths) related to a respective core pass through its interface. Moreover, in certain embodiments, and in the favor of reducing the area and power, deadlock-free buffer sharing techniques are provided such that each input port has a small packet size buffer and/or a set of available long packet size buffers to be shared among input ports.

The innovations can be implemented as part of an NoC hardware architecture (e.g., on a CMP or multi-core processor). The innovations can also be implemented as part of an electronic design automation ("EDA") tool used to generate design data for the NoC for a particular CMP or multi-core processor design (e.g., as a part of a behavioral synthesis tool that generates HDL data, a logic synthesis and/or place-and-route tool that generates gate-level netlists, a physical synthesis tool that generates physical layouts (e.g., GDSII data), or any other suitable EDA tool). In this regard, the innovations can be implemented as a method (e.g., a NoC design method, a multicore processor chips, a many-core processor), as part of a computing system configured to perform the method, or as part of computer-readable media storing computer-executable instructions for causing a processing device (e.g., a circuit, such as a microprocessor or microcontroller), when programmed thereby, to perform the method. Using the design data generated from an EDA tool implementing the disclosed techniques, mask-level models can ultimately be produced, masks can be printed, and the final integrated circuit can be fabricated (e.g., using suitable lithography techniques).

The foregoing and other objects, features, and advantages of the disclosed technology will become more apparent from the following detailed description, which proceeds with reference to the accompanying figures.

BRIEF DESCRIPTION OF THE DRAWINGS

FIGS. 4A-I are schematic block diagrams showing a 4×4 mesh topology as well as various circles for connecting nodes of the topology to one another in accordance with the disclosed technology.

FIG. 7 shows example pseudocode for a technique that generates node-connecting circles for an arbitrary NoC design.

DETAILED DESCRIPTION

I. General Considerations

Figure 1A:
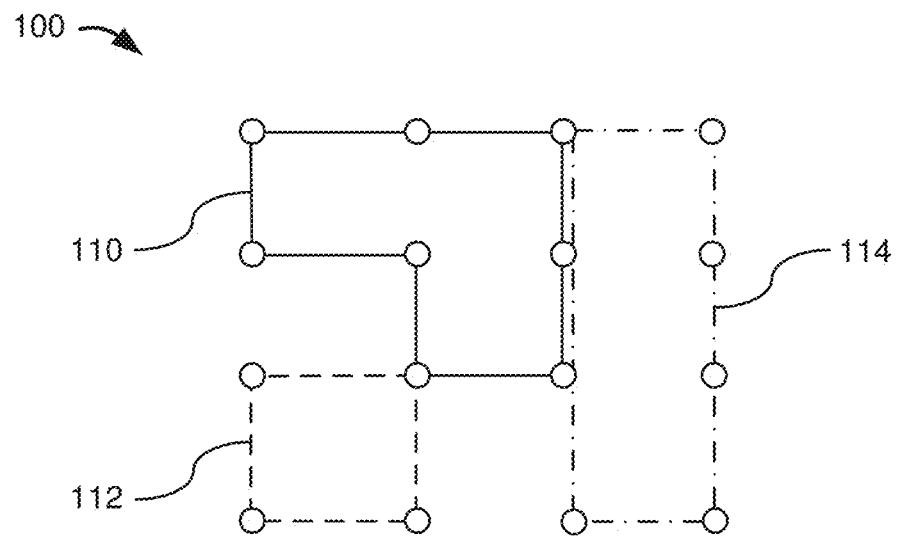
FIGS. 1A-1B are schematic block diagrams of a 4×4 topology of nodes in which several example circular paths (circles), in accordance with the disclosed technology, are depicted.

Disclosed below are representative embodiments of methods, apparatus, and systems for generating routerless networks-on-chip ("NoCs") as well as to hardware architectures for implementing such NoCs. The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. Further, the various innovations can be used in combination or separately. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the figures may not show the various ways in which the disclosed methods can be used in conjunction with other methods.

Various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Different embodiments use one or more of the described innovations. Some of the innovations described herein address one or more of the problems noted in the background. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

II. Introduction to the Disclosed Technology

Networks-on-Chip ("NoC") are becoming an increasingly significant component of chip multiprocessor ("CMP") or multi-core processor designs. Generally speaking, the NoC is the backbone that facilitates communication among multiple cores. With NoCs, processing cores can be effectively interconnected on a single chip. Similar to computer networks, NoCs directly affect many performance and cost factors of a CMP. In fact, an NoC can have a great impact on electrical and physical properties (such as power and area) of a CMP design. For instance, the power consumption of an NoC on a CMP can be 10%~36%—a highly undesirable proportion. See Hoskote et al., "A 5-GHz Mesh Interconnect for a Teraflops Processor," *IEEE Micro*, vol. 27, no. 5, pp. 51-61 (September-October 2007); Howard et al., "A 48-Core IA-32 Processor in 45 nm CMOS Using On-Die Message-Passing and DVFS for Performance and Power Scaling," *IEEE Journal of Solid-State Circuits*, vol. 46, no. 1, pp. 173-183 (January 2011). Further, with continuous advancements in processing technologies and higher clock frequencies, CMP power is increasingly becoming a major concern. Consequently, new NoC design approaches that work efficiently and effectively to achieve both high performance and with lower area cost are becoming ever more desirable.

Traditionally, there have been two types of NoCs: bus-based and router-based. A bus-based NoC has a very simple design. In this type of system, cores are attached to a bus that facilitates communications among the cores. This system functions well for few cores; however, as one attaches more cores to the bus, the system's performance degrades significantly. One of the main reasons is the distance between cores: the more cores attached to the bus, the longer the length of the bus. Hence, bus-based NoCs do not scale well with the number of nodes.

Router-based NoCs use routers, which are attached to each core. A router is a complex and relatively large component that must be carefully designed. With routers, a desired hop count is achieved by directing traffic appropriately through their shortest paths. This is typically attained by complex router designs and routing algorithms. For example, a flow control unit ("flit") has to pass through four stages on a conventional router (specifically, routing computation, VC allocation, switch allocation, and switch traversal) to correctly determine its output port. Those stages require a flit to traverse a router for several clock cycles which, as a result, affects the flit's latency. Moreover, a router comprises several components, such as buffers and crossbars, that contribute to the router's area and power consumption. For example, 28% of the total power and 17% of the die area are devoted to routers on the Intel Terascale chip. See Hoskote et al., "A 5-GHz Mesh Interconnect for a Teraflops Processor," *IEEE Micro*, vol. 27, no. 5, pp. 51-61 (September-October 2007). Notably, such area and power requirements will only be higher as more cores are added to the CMP.

In this disclosure, example embodiments of a routerless NoC design are described. In certain examples, a new NoC design approach is disclosed that intelligently uses available wiring resources that have previously been underutilized in router-based design due to their commitment to routers. Embodiments of the disclosed technology are driven by the appreciation that the data on an NoC is ultimately transferred by wires. A wire is the elemental part of any digital circuit, and its function is to transport a signal from one point to another. With wires, components (such as transistors, gates, flip-flops, and the like) can communicate and exchange data and, as a result, be integrated into more complex components, such as multiplexer, buffers, and even routers.

In certain example approaches of the disclosed technology, wires are used to connect cores in predefined circular paths. In particular implementations, each circular path is isolated from the others and all paths are arranged such that every pair of cores has a path. This predefinition and isolation of paths reduces or eliminates the need for routers and, hence, produces a savings in power consumption and area. Furthermore, in certain examples, the circular paths are intelligently placed on the NoC in order to achieve a desirable average hop count. Example of a recursive techniques for generating such circles are also disclosed herein.

Additionally, in certain embodiments of the disclosed technology, the cores (e.g., each core) are attached to the circular paths using a network interface that allows the sharing of buffer resources among circles passing through the interface. Unlike router-based NoCs, the network interface designs disclosed herein dramatically reduce power and area requirements and allow die areas to accommodate more processing and storage units.

III. Technical Observations and Challenges

As process technologies scale down to smaller dimensions, more and more features and devices can be fit onto a silicon surface. With this increasing trend in the number of available features and devices on the silicon surface, each technology node comes with more and more metal layers to meet the growing demand for integration. For example, typical many-core processor chips, such as Xeon Phi, Knights Landing or KiloCore, are fabricated using a process technology with 11 to 13 metal layers. Further, each metal layer has a pitch size that defines a minimum wire width and space between two adjacent wires. The pitch size is one of the principle factors in determining the number of available wires in each layer. In modern technology nodes, several metal layers with different thicknesses and minimum pitches are available. These physical differences between metal layers also result in different electrical characteristics (such as resistance and capacitance) and give designers an avenue for meeting their design constraints (such as delay on critical nets) by switching between different layers.

Designers are also confronted with other challenges when designing integrated circuits, such as CMPs. For instance, one of the challenging issues in interconnect design in modern technologies is crosstalk noise. In general, there are two main techniques to cope with crosstalk noise: (a) spacing; and (b) shielding. For the spacing technique, the interconnect designer tries to keep the coupling noise at a level which is tolerable by the target process and applies a desired space between wires for each layer. See, e.g., Arunachalam et al., "Optimal shielding/spacing metrics for low power design," *IEEE Computer Society Annual Symposium on VLSI*, pp. 167-172 (2003). For the shielding technique, the designer typically reduces the crosstalk noise between two adjacent wires by inserting another wire (which is usually connected to the ground or supply voltage) between them. See id. In comparison with the spacing technique, the shielding technique has more area overhead and it reduces the number of wires in each layer, but it can almost entirely suppress crosstalk noise.

Table 1 below shows statistical information for a set of example many-core processors, including the wiring resources available in two respective metal layers.

TABLE 1

| ManyCore Processor | Intel Teraflop | | | Intel IA-32 Message-Passing Processor (SCC) | | | KiloCore | | | Xeon Phi, Knights Landing | | |
|---|---|---|---|---|---|---|---|---|---|---|---|---|
| Number of Cores | 80 | | | 48 | | | 1000 | | | 72 | | |
| Die area | (21.72 mm × 12.64 mm) 275 mm² | | | (26.5 mm × 21.4 mm) 567.1 mm² | | | (8 mm × 8 mm) 64.0 mm² | | | (31.9 mm × 21.4 mm) 683 mm² | | |
| Technology | Intel65 nm | | | Intel45 nm | | | IBM 32 nm | | | Intel14 nm | | |
| Interconnect | 8 Metal Layers | | | 9 Metal Layers | | | 11 Metal Layers | | | 13 Metal Layers | | |
| Inter-router interconnects Layer | Metal Layer | Pitch | #Wire | Metal Layer | Pitch | #Wire | Metal Layer | Pitch | #Wire | Metal Layer | Pitch | #Wire |
| | M4 | 280 nm | 22571 wires | M4 | 240 nm | 44583 wires | 2 Layers 1X Metal | 100 nm | 80000 wires | M4 | 80 nm | 133750 wires |
| | M5 | 330 nm | 19151 wires | M5 | 280 nm | 38214 wires | | | | M5 | 104 nm | 102884 wires |
| Total Wires | 41722 wires (40K) | | | 82797 wires (82K) | | | 80000 wires (80K) | | | 236634 wires (236K) | | |

As mentioned, a more conservative approach to cope with the coupling noise is to use a shielding technique. The number of wires in Table 1 was calculated taking into account the area overhead of using a shielding technique to suppress the crosstalk noise Minimum metal pitches are used to estimate the number of wires for each layer.

As is revealed in Table 1, there has been a trend toward increasing the available number of wires with technology scaling and more advanced multi-core processors. Unfortunately, wires are underutilized in router-based NoCs. As the number of wires is relatively large, this opens new opportunities for new design directions that utilize more wires. An NoC that is smartly design based on wires allows routers to be removed, resulting in a routerless NoC.

A few earlier works have suggested the removal of routers. However, those works suffered from many factors, such as scalability. For instance, a point-to-point design to connect every core with the other is infeasible. For example, each node on a 4×4 mesh NoC would have 16×15=240 input and output links. This approach clearly requires a large number of buffers and results in an extremely costly NoC. A shared bus, or conventional bus, is another approach. However, the number of nodes that can be attached to such buses is limited due to noise and collision factors. As more nodes are attached to a bus, the more noise and collisions occur, thus reducing the overall performance. Ring NoCs are another possible approach to connecting a few cores. See, e.g., Barroso et al., "The performance of cache-coherent ring-based multiprocessors." *ACM SIGARCH Computer Architecture News*, vol. 21. no. 2. ACM, (1993); Delp et al., "Memory as a network abstraction," *IEEE Network*, 5(4), pp. 34-41 (1991); and Barroso et al., "Cache Coherence on a Slotted Ring," *ICPP* (1), pp. 230-237 (1991). Like the shared bus approach, however, this approach suffers from scalability and performance issues. As the number of cores on a CMP increases, rings become very slow and no longer scalable.

Recently, a multi-ring NoC approach called integrated multiple rings (IMR) was introduced. See Liu et al., "IMR: High-Performance Low-Cost Multi-Ring NoCs," *IEEE Transactions on Parallel and Distributed Systems*, 27(6), pp. 1700-1712 (2016). IMR deploys a set of multiple rings such that each ring is to be shared by a specific set of cores. Also, packets are not allowed to switch between rings. However, the ring set is generated by an evolutionary algorithm, which takes a long time to produce a good ring set. Further, such evolutionary-generated ring sets are prone to producing large rings that affect packet latency, hop count, and power consumption. In addition, the design proposes require a large set of buffers to assure deadlock avoidance.

Buffers can also be helpful to an NoC design. Although buffers contribute negatively on area and power resources, they can help eliminate many issues such as deadlock. Recently, a bufferless technique was introduced to reduce power consumption. See, e.g., Fallin et al., "CHIPPER: A low-complexity bufferless deflection router," *IEEE 17th International Symposium on High Performance Computer Architecture*, pp. 144-155 (February 2011). Bufferless designs, however, suffer from numerous disadvantages. For example, bufferless designs suffer from livelock, deflection, and packet reassembly issues. The designs, however, do realize some gains in the savings of power consumption and area. Even though buffers consume some amounts of power, other routers components also consume significant amounts of power (e.g. 45%) regardless if buffers exist or not. See, e.g., Chen et al., "Nord: Node-router decoupling for effective power-gating of on-chip routers," *Proceedings of the 2012 45th Annual IEEE/ACM International Symposium on Microarchitecture*, pp. 270-281 (December 2012).

Therefore, by eliminating routing components and reducing buffer size, an NoC design can realize a substantial reduction to the consumption of static power. Embodiments of the disclosed technology realize both of these objectives. For instance, certain embodiments of the disclosed technology reduce buffer size by allowing different components to share buffers. Further, by reducing or eliminating routers, a significant savings in power consumption and area can be gained. However, the challenge is how to link cores in the NoC without losing the performance advantages and path flexibilities of a router while still providing a scalable approach.

As noted, there is an increasing trend in the number of available wires in advanced many-core processors. Therefore, one could speed up data transfer from one component to another by utilizing more wires. However, linking a component with more wires increases the component's size and power consumption. For example, if two routers are connected by 256 bit links, then doubling the number of wires on a link would, at least, double the crossbar size for each router. Thus, adding more wires to link routers is not an efficient approach.

Further, conventional NoC designs have limited capabilities to use the large amount of wires due to the power and area requirements of routers with wider ports. For example, a 4×4 mesh with 64 bit flit size needs a die of around 2.16 mm×2.36 mm in a 45 nm technology node. See Park et al., "Approaching the theoretical limits of a mesh NoC with a 16-node chip prototype in 45 nm SOI," *Proceedings of the 49th Annual Design Automation Conference*, pp. 398-405 (June 2012). For this die size and based on the pitch size listed in Table 1 for a 45 nm technology node, two metal layers (M4 and M5) can provide 8357 wires in cross-section (4500=2.16 mm/(2×240 nm) wires in metal layer 4, pitch size is doubled in order to take into account the area overhead of shielding technique, and 3857=2.16 mm/(2× 280) nm wires in metal layer 5). However, a 4×4 mesh with a 64 bit flit size can only use (4×64) 256 wires in the cross-section. This means that the mesh NoC design can only utilize 4% of all available wire resources in only two metal layers. On the other hand, increasing the flit size to enhance the wire resource utilization results in more buffers and a larger crossbar in routers, resulting in higher power consumption and area overhead. Therefore, new NoC designs that can better utilize the large amount of available wires with low power and area are highly desirable for current and future multi-core processors.

Embodiments of the disclosed technology implement a wired-based NoC by forming multiple unidirectional circular paths, also referred to as "circles". These circles are wiring loops that connect two or more nodes to one another. In particular implementations, every pair of nodes on the NoC shares at least one circle. Using wires, one can form a number of circles such that routers are no longer required, thus facilitating a routerless NoC.

It should be noted that a "circle" as discussed herein is not strictly circular in shape, but rather traverses a set of two or more nodes along a path that forms a closed loop and is therefore circular in nature. Typically, though not necessarily, the nodes traversed by a circle are arranged (or, as part of the circuit design process, considered to be arranged) in an arrangement of columns and rows. For this reason, the disclosure will sometimes refer to a particularly numbered row or column (or a "lowest" or "highest" row or column), which references a row numbered consecutively from top to bottom (or, equivalently, bottom to top) or a column numbered consecutively from left to right (or, equivalently, right to left). This arrangement is typically described as an n×n mesh topology, where n is a positive integer, or an m×n mesh topology, where m and/or n are positive integers. For ease of illustration, such arrangements are shown herein rectilinearly. The actual arrangement or final physical layout, however, need not be strictly rectilinear. Instead, the references to "columns", "rows", and "mesh topologies" discussed herein encompass equivalent logical relationships between nodes (or cores). Further, it should be understood that the terms "rows" and "columns" encompass the equivalent conversion to "columns" and "rows".

Figure 1B:
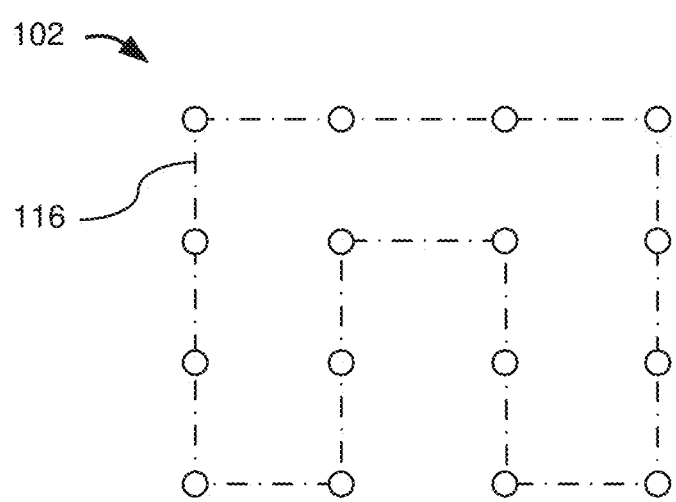

Theoretically speaking, the number of circles on a n×n mesh topology is abundant and grows rapidly with n. For example, in a 4×4 topology of nodes, the total number of possible circles is 426. FIGS. 1A and 1B are schematic block diagrams of a 4×4 topology 100, 102 of nodes in which several example circles (110, 112, 114, 116) are depicted. Further, in FIGS. 1A and 1B as well as the other figures depicting n×n mesh topologies, each node of the mesh represents a connection point of a core of the many-core processor design to the NoC. Moreover, for bigger meshes, the number of circles are numerous. In particular, Table 2 shows the total number of circles for various mesh sizes.

TABLE 2

| n | # of directed rings in n × n mesh |
|---|---|
| 2 | 2 |
| 3 | 26 |

TABLE 2-continued

| n | # of directed rings in n × n mesh |
|---|---|
| 4 | 426 |
| 5 | 18698 |
| 6 | 2444726 |
| 7 | 974300742 |
| 8 | 1207683297862 |

For an 8×8 mesh topology, there are more than $10^{13}$ circles, not to mention combinations. While it is easy to connect all the nodes with lengthy circles, such as Hamiltonian circles (an example of which is shown as circle 116 in FIG. 1B), such circles greatly increase the average hop count and, as a result, are not recommended for NoCs.

To generate a set of circles that minimizes or otherwise significantly reduces the hop count is very challenging due to large number of choices. Embodiments of the disclosed technology are directed to tools and techniques for addressing these difficulties by generating circles using deterministic techniques that also significantly reduce the average hop count set of circles. Particular implementations use a fast, recursive algorithm for determining the circles.

IV. Example Approaches to Routerless NOC Design

This section presents examples of a routerless ("RL") design for an n×n mesh topology. Embodiments of the disclosed approach utilize the abundant wiring resource by intelligently placing a set of circles that interconnects nodes on the mesh. Further, in some implementations, the set of circles is generated by a fast and recursive algorithm. In particular implementations, the circles (e.g., all circles) are unidirectional, have a rectangular shape, and have the same width of wires. As a result of the circles, the paths from a source to a destination are predefined; consequently, once a packet is pushed to a downstream circle, it remains on the same circle until the destination ejects it. Hence, the role of a router is no longer required and can therefore be eliminated.

Further, in some embodiments, a node (e.g., each node) on the mesh is connected to its corresponding core (e.g., a processing core of a multi-core processor) with a network interface to access the NoC such that all circles that contain the node pass through the interface. Although the wiring resources are large, attaching too many wires to an interface would increase the interface's buffer and, eventually, the demand for the power and area becomes undesirable. Therefore, for the purpose of controlling the power and area requirements, certain embodiments limit the maximum number of circles overlapping at any link to n, where n is the dimension size of the mesh topology.

In the next subsections, several example embodiments are presented to show how circles are generated followed by a formal description of an illustrative non-limiting algorithm that recursively generates the circles. Details of example network interfaces and hardware implementations are then introduced and discussed.

A. Circle Generation Examples

In this subsection, example techniques for generating circles for 2×2, 4×4, 6×6, and 8×8 mesh topologies are described. In general, circles generated for an n×n mesh are denoted by $M_n$.

Figure 2:
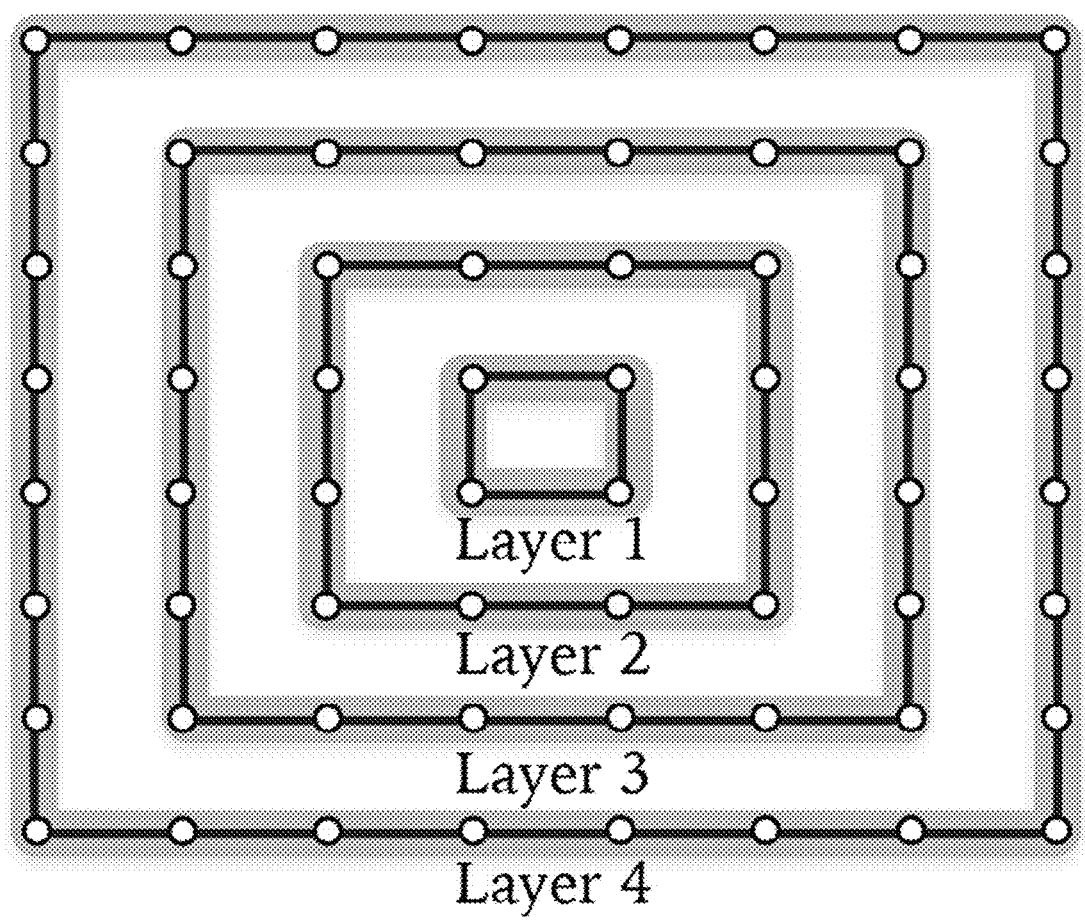
FIG. 2 is a schematic block diagram illustrating the layers for an 8×8 mesh, where each layer is labeled.

In accordance with one exemplary technique, the mesh is split into layers. FIG. 2 is a schematic block diagram 200 illustrating the layers for an 8×8 mesh, where each layer is labeled. As shown in FIG. 2, Layer 1 is a 2×2 mesh, Layers 1 & 2 form a 4×4 mesh, Layers 1 & 2 & 3 combined result in a 6×6 mesh, and finally all layers form the original 8×8 mesh. Due to the structure of layers, circles generated for an n−2×n−2 mesh can be a subset of circles generated for n×n mesh topology. Furthermore, FIG. 2 illustrates that the layers are concentric in nature. For purposes of this disclosure, let $M_n$ denote the set of circles on an n×n mesh and $L_i$ be the set of circles generated specifically for Layer i. More details are discussed below in the examples.

i. 2×2 Mesh Topology

Figure 3A:
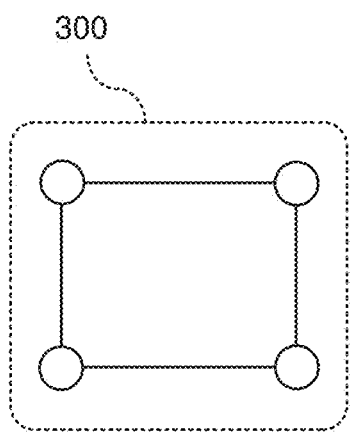
FIGS. 3A-C are schematic block diagrams showing a 2×2 mesh topology as well as a clockwise and counterclockwise circle for the topology.
Figure 3B:
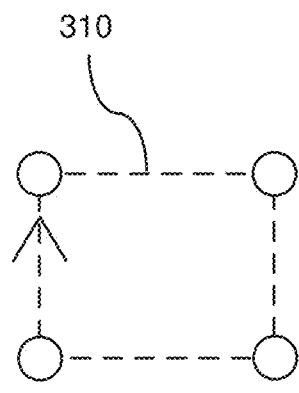
Figure 3C:
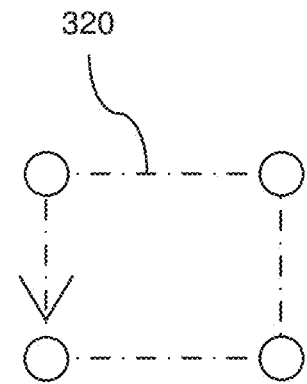

This is the basic case. It has one layer and two circles, as shown in FIGS. 3A-3C. More specifically, FIG. 3A is a schematic block diagram of the overall 2×2 mesh topology 300; FIG. 3B illustrates clockwise circle 310 on the topology; and FIG. 3C illustrates counterclockwise circle 320. Both circles are included in $M_2=L_1$. Notice that, with $M_2$, the mesh is interconnected and the maximum number of circles overlapping at any link is 2. Also, the average hop count is 0.333.

ii. 4×4 Mesh Topology

In the case of the 4×4 mesh topology, the mesh has two layers. For example, FIG. 4A is a schematic block diagram of the overall 4×4 mesh topology 400 and shows that the topology has 2 layers: Layer 1 and Layer 2. For Layer 2, the set of circles $L_2$ is generated and depicted by circles 410, 412, 414, 416, 418, 420, 422, 424 in FIGS. 4B-4I. Notice that the two circles 410, 414 in FIGS. 4B and 4D connect nodes (which represent respective cores and their respective interfaces) on Layer 2 with all nodes on Column 2. Similarly, nodes on Column 3 are connected to Layer 2 nodes by the circles 412, 416 shown in FIGS. 4C and 4E. Then, the nodes on Row 1 are connected to Row 2 nodes by the circle 418, the nodes on Row 2 are connected to Row 3 by the circle 420, and the nodes Row 3 are connected to Row 4 by the circle 422. Finally, the perimeter nodes are connected by the largest circle 424, which also is oriented in the opposite direction of circles 410, 412, 414, 416, 418, 420, 422 (clockwise vs. counterclockwise or vice versa depending on the directionality of the circles 410, 412, 414, 416, 418, 420, 422). Therefore, circles in $L_2$ connect nodes on Layer 2 with every other node in the mesh. Moreover, in this illustrated embodiment, exactly four circles are overlapping at every link (which corresponds to a set of wires linking components (such as nodes) to one another) on Layer 2 and, in like manner, every other link (not on Layer 2) is overlapped by two circles. Links on Layer 2 can no longer allow more circles to overlap as the maximum is four, whereas links on Layer 1 have room for two more circles. Therefore, $M_2$ can be used to interconnect all nodes on Layer 1 (as Layer 1 is a 2×2 mesh) with at most two circles overlapping at any link. The final set is $M_4=L_2 \cup M_2=L_2 \cup L_1$ where the average hop count is 2.93.

iii. 6×6 Mesh Topology

Figure 5A:
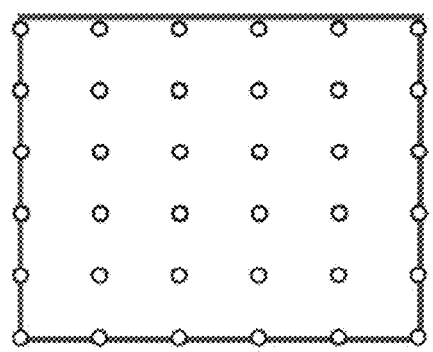
FIGS. 5A-D are schematic block diagrams showing a 6×6 mesh topology as well as various circles for connecting nodes of the topology to one another in accordance with the disclosed technology.
Figure 5B:
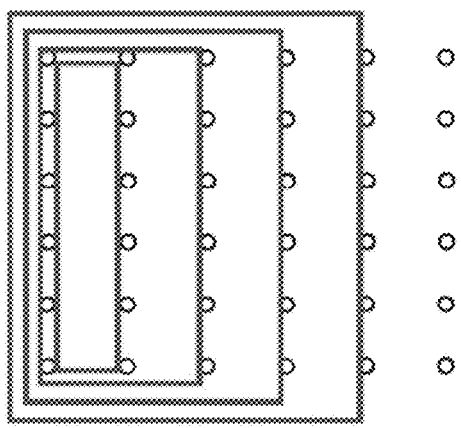
Figure 5C:
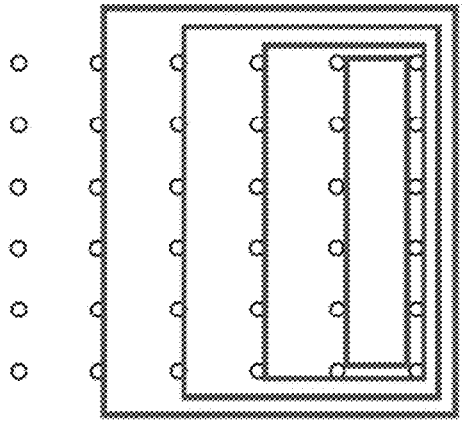
Figure 5D:
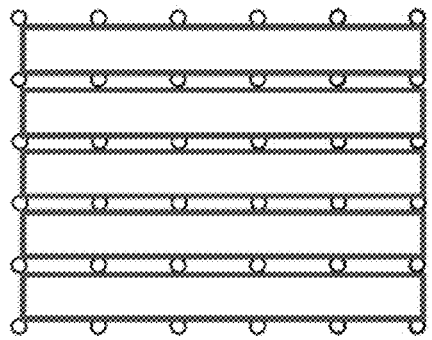

For the 6×6 topology, there are 3 layers in this mesh. In a similar fashion as above, circles in $L_3$ are generated for Layer 3 as illustrated in FIGS. 5A-D. For ease of illustration, FIG. 5 depicts related circles together in composite images. FIG. 5A, for example, shows a largest circle 510 traversing the perimeter nodes along one direction (either clockwise or counterclockwise). FIG. 5B shows the circles 512 that extend from column 2 incrementally toward column 5. In the illustrated embodiment, the circles 512 are oriented in the opposite direction of circle 510. FIG. 5C shows the circles 514 that extend from column 5 decrementally toward column 2. In the illustrated embodiment, the circles 514 are oriented in the opposite direction of circle 510. FIG. 5D shows the circles 516 that form incremental circles for adjacent pairs of rows and that are also oriented in the opposite direction of circle 510. Again, all nodes on Layer 3 are connected to every other node in the mesh by circles in $L_3$. Links on Layer 3 are overlapped by six circles and all other links are overlapped by two circles. Therefore, $M_4$ can be used to interconnect all nodes on layers 2 and 1. In certain embodiments, for the purpose of improving the average hop count, every circle in $M_4$ is reversed and rotated 90°. This new set is denoted by $M'_4$. As a result, $M_6=L_3 \cup M'_4=L_3 \cup (L_2 \cup L_1)'$ with an average hop count of 5.07. Note that, in the previous example, it was not necessary to reverse and rotate the circles in $M_2$ because $M_2=M'_2$.

iv. 8×8 Mesh Topology

Figure 6A:
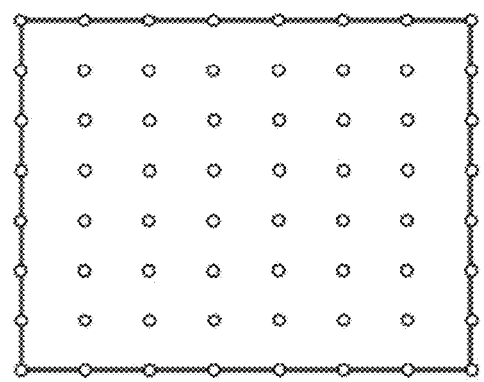
FIGS. 6A-D are schematic block diagrams showing a 8×8 mesh topology as well as various circles for connecting nodes of the topology to one another in accordance with the disclosed technology.
Figure 6B:
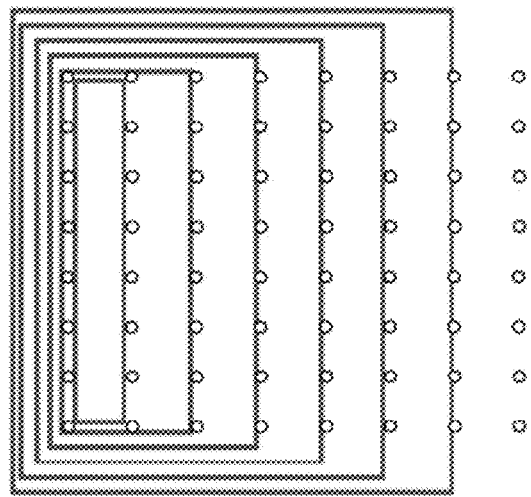
Figure 6C:
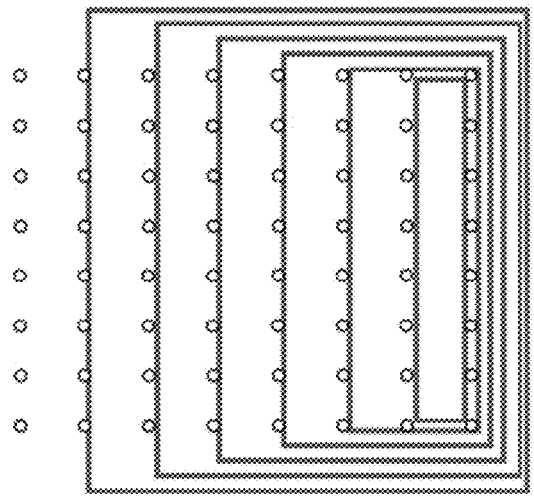
Figure 6D:
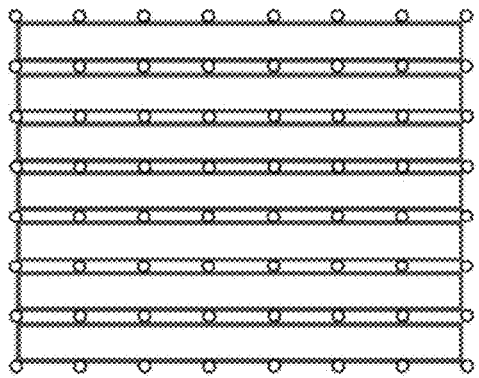

Similar to the earlier examples, the circles can be generated using the outer layer (Layer 4) to generate $L_4$. For ease of illustration, FIG. 6 depicts related circles together in composite images. FIG. 6A, for example, shows a largest circle 610 traversing the perimeter nodes along one direction (either clockwise or counterclockwise). FIG. 6B shows the circles 612 that extend from column 2 incrementally toward column 7. The circles 612 can be oriented in the opposite direction of circle 610. FIG. 6C shows the circles 614 that extend from column 7 decrementally toward column 2. The circles 614 can be oriented in the opposite direction of circle 610. FIG. 6D shows the circles 616 that form incremental circles for adjacent pairs of rows and that are also oriented in the opposite direction of circle 610. Then, using earlier results, $M_8$ can be defined as:

$$M_8 = L_4 \cup M'_6 = L_4 \cup (L_3 \cup M'_4)' = L_4 \cup (L_3 \cup (L_2 \cup L_1)')'$$

where the average hop count is 7.32.

B. Formal Description

For an n×n mesh topology, circles for the routerless design can be recursively generated. One example of such an algorithm (termed "RLrec") is illustrated in example pseudocode 700 shown in FIG. 7. In the illustrated example, the algorithm begins by generating circles for the outer layer, say layer i, and then recursively generating circles for layer i−1 and so on until the basic case (Layer 1) is reached or the layer has a single node.

The example algorithm takes two integers L and H as input parameters with initial values 1 and n, respectively. L denotes the lowest row/column and H denotes the highest row/column. Using L and H, the number of layers is $$x = \left\lceil \frac{H-L+1}{2} \right\rceil = \left\lceil \frac{n}{2} \right\rceil.$$

In subsequent recursive calls, RLrec is called with L=L+1 and H=H−1 to work on the next layer. The first set of circles generated by RLrec is for the boarder layer (layer x). The example algorithm begins with $$C(L,H,L,H,\text{anticlockwise}) \tag{1}$$

which overlaps with layer x. The procedure C ($r_1$, $r_2$, $c_1$, $c_2$, d) draws two lines on rows $r_1$, $r_2$ and two lines on columns $c_1$, $c_2$ and generates a circle with direction d from the resultant rectangular shape. FIG. 6A shows an example result for C (0, 7, 0, 7, anticlockwise). Moreover, the next generated circles are $$C(L,H,L,i,\text{clockwise}) \ \& \ C(L,H,i,H,\text{clockwise}) \tag{2}$$

where L+1≤i≤H−1 and correspond to the circles in FIGS. 6B and 6C. The pair of circles C(L, H, L, i, clockwise) & C(L, H, i, H, clockwise) overlaps with layer x and column i.

Notice that, every column, other than L, H, is overlapped by two circles only. The circles generated so far allow every node on layer x share at least one circle with every column. In other words, each node on layer x shares at least a circle with every other node on the mesh. Also, every link on layer x is overlapped by $$\underbrace{1}_{\text{from}(1)} + \underbrace{H-1-(L+1)+1}_{\text{from}(2)} = H-L = n-1$$

circles and every link on columns L+1 . . . , H−1 is overlapped by exactly two circles. There are n−2 pairs of circles generated by (2). Observe that, rows L+1, L+2, . . . , H−1 are not yet utilized by any circle. The last set of circles generated is $$C(i,i+1,L,H,\text{clockwise}) \tag{3}$$

where L≤i≤H−1. This set is similar to circles in FIG. 6D. The two circles C(i, i+1, L, H, clockwise) & C(i+1, i+2, L, H, clockwise) overlap at row i+1 only and all circles in this set use each link on layer x only once. Therefore, links on layer x are now overlapped by n circles and every other link is overlapped by two circles. Finally, the algorithm recursively calls RLrec with L=L+1 and H=H−1 and then reverses and rotates for 90°. Calling RLrec with L=L+1 and H=H−1 will ignore layer x and generate circles for the outer layer of an n−2×n−2 mesh (layer x−1). Notice that, initially L=1 and H=n and therefore, H−1−(L+1)+1=n−2 (the dimension size of the mesh.)

The number of circles generated by RLrec can be easily calculated due to its simplicity and recursive nature by the following recurrence function:

$$F(n) = \underbrace{1}_{\text{from}(1)} + \underbrace{2 \times (n-2)}_{\text{from}(2)} + \underbrace{n-1}_{\text{from}(3)} + F(n-2),$$

where F(2)=2 and F(1)=F(0)=0.

C. Example Network Interfaces

In embodiments of the disclosed technology, a node in the NoC is part of many circles where such circles allow the node to communicate with every other node in the NoC. In other words, the circles avail the node with predefined paths to all destinations. In particular embodiments, a node communicates with the circles through a network interface.

Figure 8:
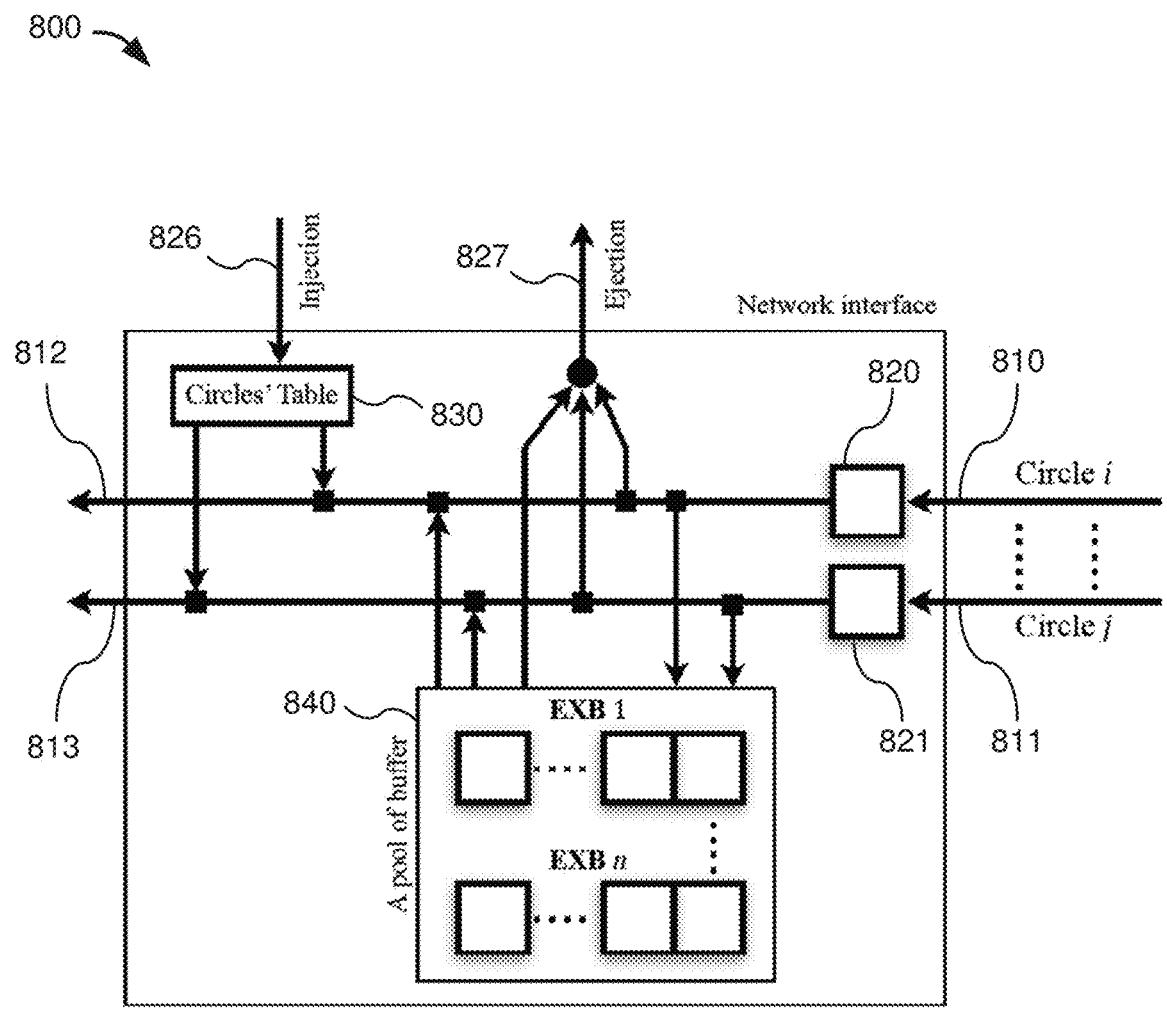
FIG. 8 is a schematic block diagram of an example network interface with exemplary components.

FIG. 8 is a schematic block diagram 800 of an example network interface with exemplary components. With reference to FIG. 8, each circle is represented by an input port (shown by representative input ports 810, 811 for circles i and circle j, respectively), an output port (shown by representative output ports 812, 813 for circles i and circle j, respectively), and a small buffer of $B_c \geq 1$ flits (shown by representative buffers 820, 821 for circles i and circle j, respectively). The flit size is fixed and the smallest packet in the NoC has $B_c$ flits (e.g., the circle's buffer can accommodate the smallest packet). The network interface also includes injection port 826 and one or more ejection ports 827 for receiving packets from the associated core and outputting packets to the associated core, respectively. In addition, in certain embodiments, the network interface comprises a pre-calculated table 830 (e.g., a look-up table) that maps destinations with the circles to reach those destinations. Moreover, a pool of one or more buffers 840 ("expansion buffers") is available to allow a circle's buffer to be expanded. Each buffer in this pool is of $B_{EXB} \geq 1$ flits and can be used by at most one circle at a time and is denoted by extension buffer (EXB). Moreover, the largest packet in the NoC has at most $B_c+B_{EXB}$ flits. Notice that, in the illustrated embodiment, each circle is completely isolated from the others. Therefore, if a packet is injected into a circle, it will remain in the same circle until ejection.

In the following paragraphs, an example of how the interface operates is described.

When a packet p of n flits is injected into the interface, the available circles that can reach the packet's destination are identified. In particular example embodiments, a circle is considered available if one of the following conditions holds:

1. The buffer is empty and either: (a) $n \le B_c$; or (b) $n \ge B_c$ and an EXB is available; or
2. The buffer is not empty and has $x \ge 0$ free flit slots and the destination of the head flit is the current node and either: (a) $n \le x$; (b) the buffer is extended by an EXB and has at least n free slots in total; or (c) the buffer is not extend by an EXB, $n \ge B_c$, $n \le B_{EXB}+x$, and an EXB is available.

Once the list of available circles is known, the shortest circle to the destination, say $\zeta$, to inject p is selected. While the interface is injecting the head flit of p, it will attach an EXB to $\zeta$ if $n \ge B_c$ and $\zeta$ is not already attached to an EXB. Moreover, the output port of $\zeta$ will be busy injecting the n flits of p for n clock cycles. During those n clock cycles, any incoming flit through input port of $\zeta$ is enqueued in the buffer. Notice that $\zeta$ has sufficient space to accept n flits while p is being injected. If no circle is available, p will be blocked or stalled at injection port and will try again in the next cycle.

One of the reasons to consider a circle as not available for injection is if the destination of the head flit in its buffer is not the current node. In this case, and in particular embodiments, the circle forwards the head flit through the output port directly regardless of the interface or the NoC state. The only case to stall such a flit is if the output port of the circle is in use for injection prior to the flit's arrival to the head of the circle's buffer. Moreover, if a circle's buffer is extended by an EXB, then this EXB will be tied with the circle until the circle's buffer and the EXB are both empty. In this case, the EXB will be freed and returned to the pool.

The discussion above concerns how an interface can inject, stall, and forward a packet. The remaining action on a packet is ejection. In particular example embodiments, the ejection process can begin as soon as the head flit of a packet p becomes the head flit of a circle's buffer in the destination's interface. In the same cycle, the interface begins ejecting flits p, one flit per cycle. Once p is fully ejected, the interface will wait for another packet to eject. If multiple packets reach the head of multiple circle's buffers, all such packets will compete for the ejection link and the oldest packet will win (though other prioritizations are also possible, including the packet being associated with a flag or other indication of a highest priority packet). Packets that lost their chance for ejection will be stalled and try again in the next cycle as long as their circle's buffer is not full. In the case of a full buffer, the packet is forwarded to the next interface. If the interface has multiple ejection ports, then it can eject in parallel m packets, where m is less than or equal to the number of circles in the interface. If more than m packets are competing to eject, and in certain embodiments, the oldest m packets wins (though other prioritizations are also possible, including the packet being associated with a flag or other indication of a highest priority packet).

Notice that in the example embodiments described above, the described operational actions do not depend on the state of a neighboring interface nor the NoC. In addition, the interface is always welcoming incoming flits from its neighbors. Allowing the interface to always accept a flit helps the NoC to avoid deadlocks as described in the next subsection.

i. Deadlocks

Figure 9:
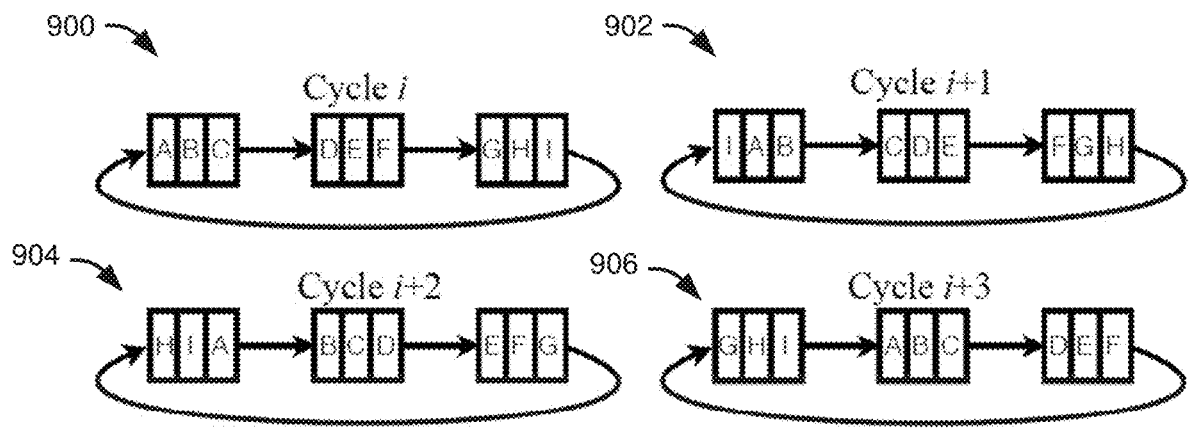
FIG. 9 shows schematic block diagrams illustrating how flow control units can loop in a circle for four incremental clock cycles in accordance with one example embodiment.
Figure 10:
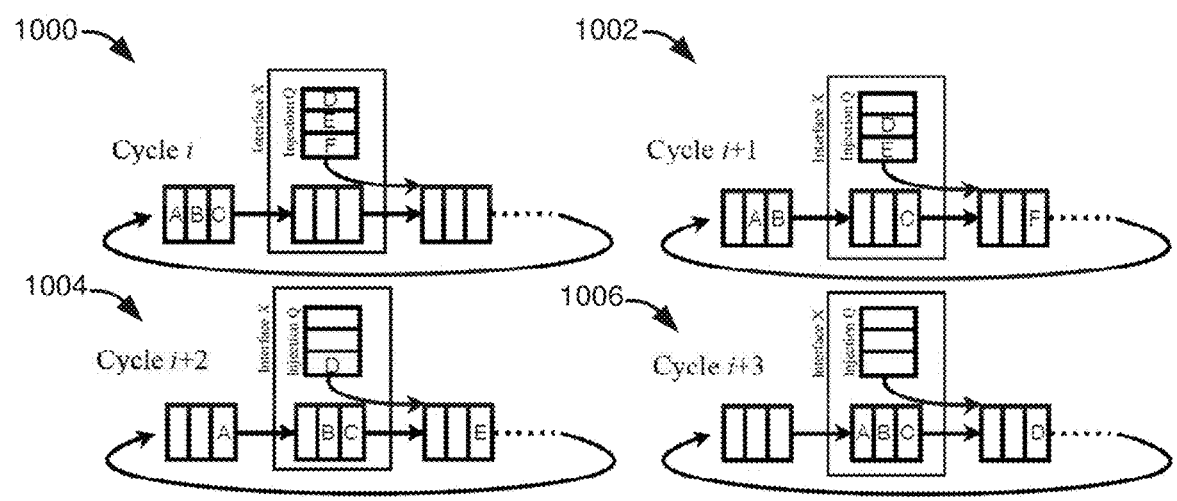
FIG. 10 shows schematic block diagrams illustrating how a packet of three flow control units can be injected into an example embodiment of the interface.
Figure 11A:
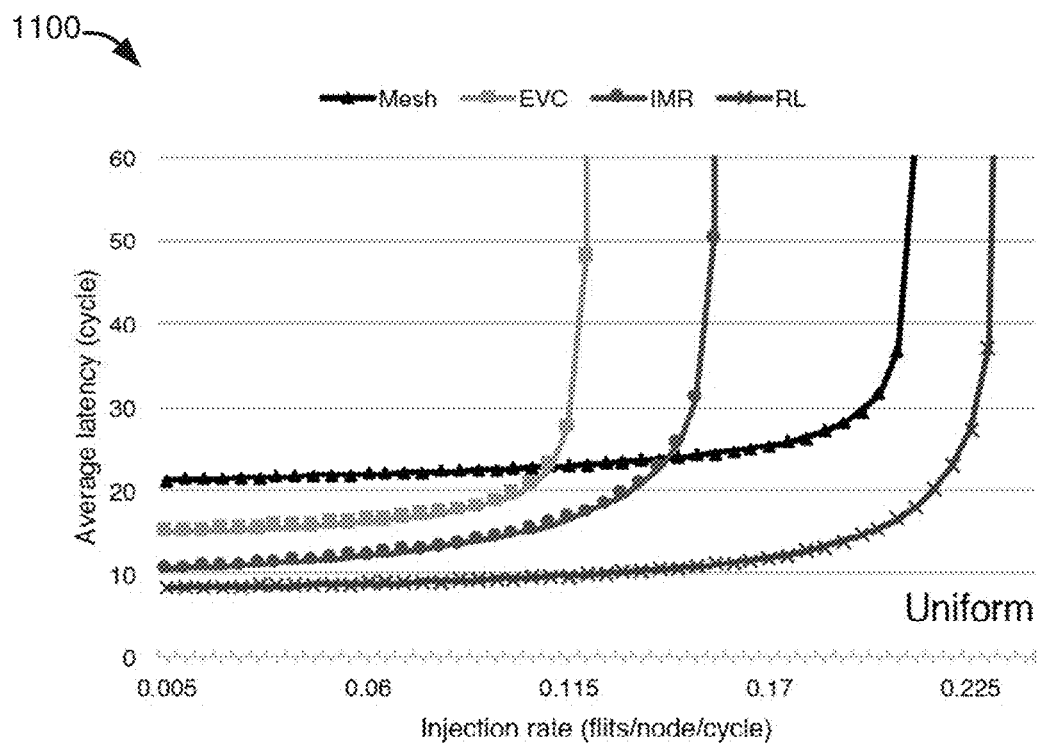
FIGS. 11A-D show plots illustrating the latency and throughput details for various experiments performed comparing the disclosed design techniques with other techniques.
Figure 11B:
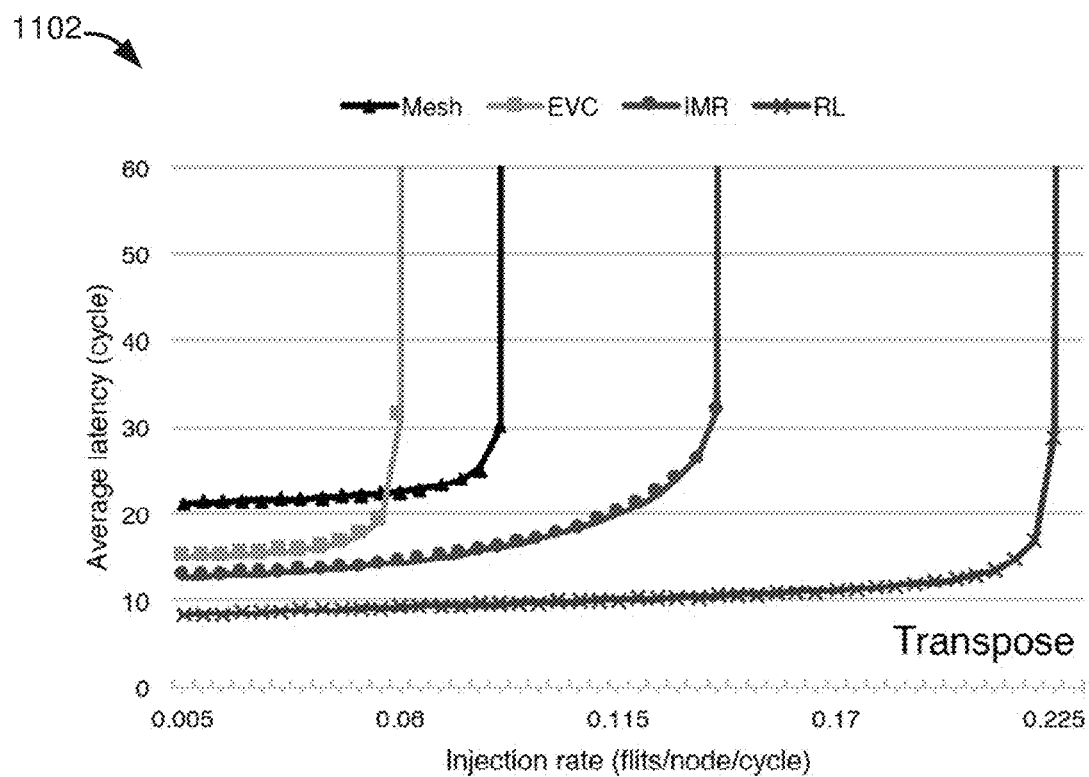
Figure 11C:
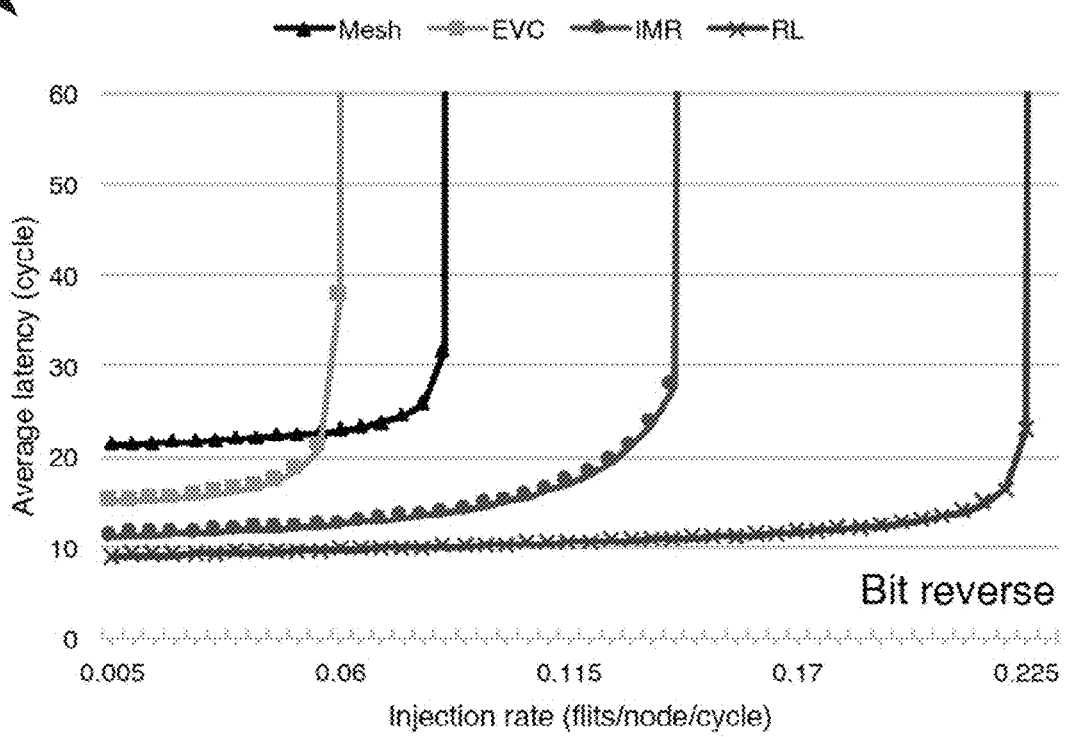
Figure 11D:
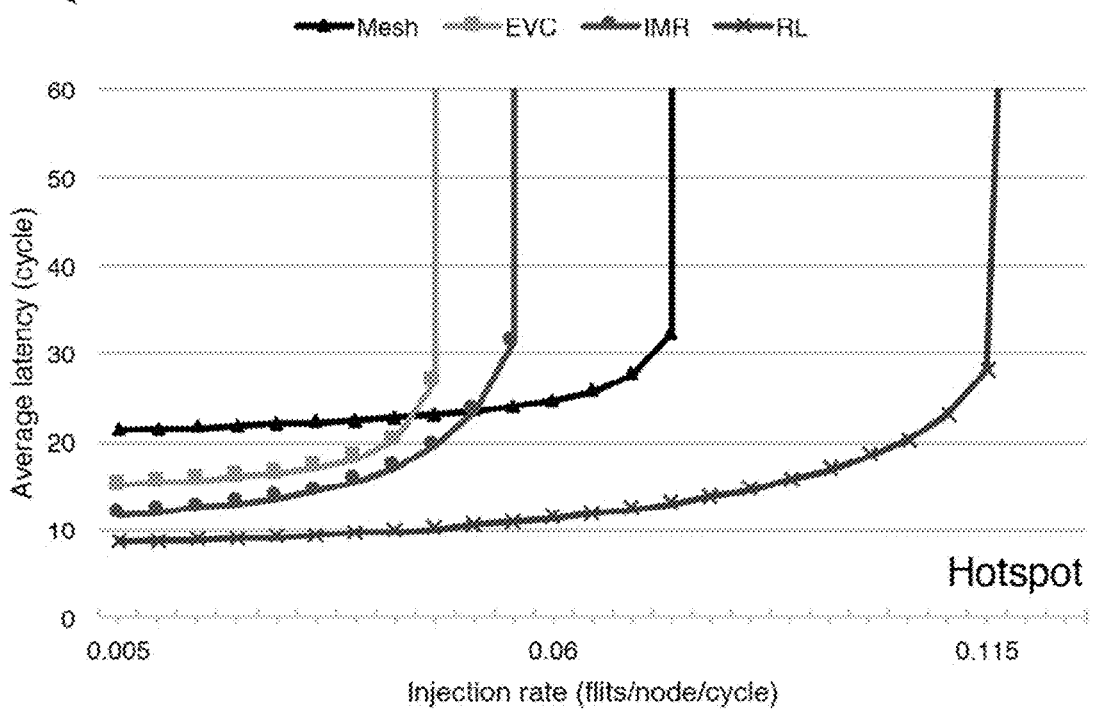

Deadlocks occur when each member of a group is holding a resource and each member is waiting for another resource, held by another member, to complete its task. Examples of the disclosed network design are not credit based; instead, each interface works solely by itself, and each of its ports can accept an incoming flit regardless of its state or NoC state. Moreover, the isolation of circles eliminates many problems introduced by "head-of-line" blocking. FIG. 9 shows schematic block diagrams 900, 902, 904, 906 showing how flits can loop in a circle for four incremental clock cycles in accordance with one example embodiment. In every cycle, flits are forwarded to the next interface, and it is the interface's responsibility to assure space availability for incoming flits without any prior information. FIG. 10 shows schematic block diagrams 1000, 1002, 1004, 1006 showing how a packet of three flits can be injected into an example embodiment of the interface as described above. In FIG. 10, notice that flits A, B, C are blocked in the middle interface 1020 until the injection process is completed.

V. Evaluation Methodology

Embodiments of the disclosed technology were extensively evaluated using Booksim, a cycle-accurate simulator, for synthetic traffic. See Jiang et al., "A detailed and flexible cycle-accurate network-on-chip simulator," 2013 *IEEE International Symposium on Performance Analysis of Systems and Software (ISPASS)*, pp. 86-96 (April 2013). Although synthetic workloads may be practical, they do not capture the essence and actual behavior of real-world applications. To help simulate real-world applications, the Synfull application was used. Synfull has a synthetic traffic generation methodology that better reflects an actual application's behaviors. See Badr et al., "SynFull: synthetic traffic models capturing cache coherent behavior," 2014 *ACM/IEEE 41st International Symposium on Computer Architecture (ISCA)*, pp. 109-120 (June 2014). Synfull uses a variety of PARSEC and SPLASH-2 benchmarks and is based on 16-core multi-threaded applications. See Bienia, "Benchmarking modern multiprocessors," New York: Princeton University, Ph.D. Thesis (January 2011); Woo et al., "The SPLASH-2 programs: Characterization and methodological considerations," *ACM SIGARCH Computer Architecture News*, vol. 23, no. 2, pp. 24-36 (July 1995). Synfull also integrates well with Booksim. For the tests disclosed herein, Synfull and Booksim are used to evaluate power and area.

For the purpose of evaluation, an exemplary routerless ("RL") design as described herein (comprising circles generated according to the technique illustrated in FIG. 7 and having a network as in FIG. 8) was compared against three NoC designs, including a traditional mesh design (denoted as mesh), EVC design (as described in Kumar et al., "Express virtual channels: towards the ideal interconnection fabric," *ACM SIGARCH Computer Architecture News*, vol. 35, no. 2, pp. 150-161 (2007), and an IMR design.

The configuration details for each design are as follows. For the mesh design, the router was configured with two virtual channels (VCs) per link with three flit buffers per VC. Also, the router's latency was minimized by setting lookahead routing with speculative switch allocation, and setting the number of cycles for each pipeline stage to one. Such a configuration allowed for the optimization of router performance and made it very competitive with the least amount of area for buffers. Furthermore, the EVC design had the same configuration as the mesh design except that one extra VC was dedicated to implement the express channels.

The IMR design was implemented in Booksim. The interface had one injection link and one ejection link and every other link was equipped with a full packet-size buffer. Additionally, the per-hop latency for every interface was one clock cycle. The maximum number of links between a pair of nodes was 16. In this regard, the limit was set to n to allow a fair comparison of the RL design with IMR.

For the RL design, the network interface was implemented such that every link had one flit-size buffer and two extension full packet-size buffers for injection purposes and two ejection links. After several experiments, it was found that having one ejector degraded performance, but having two ejectors greatly enhanced performance. For more than two ejectors, the performance gain was negligible. Similarly, with one extension buffer, the injection link suffered from being blocked for a long time and hence performance was affected negatively. With two extension buffers, significant performance improvements were realized. Desirably, the design has as many extension buffers as the input ports, but this may affect interface area and static power negatively. Finally, the circles were generated by the technique illustrated in FIG. 7.

The width of each link for the mesh and EVC designs is 256 bits, while for the RL and IMR designs it is 128 bits. From the link width, the maximum flits per packet can be determined. The control packet is of 64 bit and the data packet is of 576 bit. Therefore, the control packet was a one flit packet for all NoCs, while the data packet in the mesh and EVC designs was a three flits packet, and for the RL and IMR designs it is a five flits packet.

A. Synthetic

In this section, results are described from simulating the above NoCs in Booksim using four synthetic patterns (uniform random, transpose, bit reverse, and hotspots for 8 hotspot nodes) on an 8×8 mesh topology. In each test, the simulator ran for 100,000 cycles to collect latency and throughput statistics at different injection rates. The ratio of long and short packets was 2 to 8. The initial injection rate for all the runs is 0.005 and it was incremented by 0.005 until reaching the throughput.

The latency and throughput detail are shown in plots 1100, 1102, 1104, and 1106 of FIGS. 11A-D for a variety of injection rates for each traffic pattern. Notice that the RL design performed normally under all injection rates in all traffic patterns. This gives an indication that the RL design is a deadlock-free approach with flit size buffers at input links and few extension buffers. Moreover, the RL design outperformed all other NoCs in latency and throughput. The average packet latency in uniform traffic pattern was 21.2, 14.9, 10.5, and 8.3 cycles for the mesh, EVC, IMR, and RL designs, respectively. Other traffic patterns had similar trends. Therefore, the RL design outperformed all other NoCs in latency and provided an average improvement of 59%, 43%, and 25% over the mesh, EVC, and IMR designs, respectively.

Regarding throughput, a similar trend was observed. For example, the throughput for the hotspot pattern was 0.08, 0.05, 0.06, and 0.125 (per flit/node/cycle) for the IMR, RL, mesh, and EVC nodes, respectively. It was also observed that the RL design had the highest throughput and performed very well for the bit reverse, hotspot, and transpose patterns. The RL design, on average, enhanced the throughput by 94%, 187%, and 68% over the mesh, EVC, and IMR designs, respectively.

B. PARSEC and SPLASH-2

Using Synfull, all benchmark traffic patterns were generated and the latency was evaluated for over 500,000 cycle for 4×4, 8×8, and 16×16 mesh topologies. For 8×8 topologies, Booksim was interfaced with 4 Synfull processes where each Synfull process is mapped randomly to 16 nodes such that a node is mapped to only one Synfull process. Similarly, for 16×16 topologies, Booksim was interfaced with 16 Synfull processes and, again, each Synfull process is mapped randomly to 16 nodes.

Figure 12A:
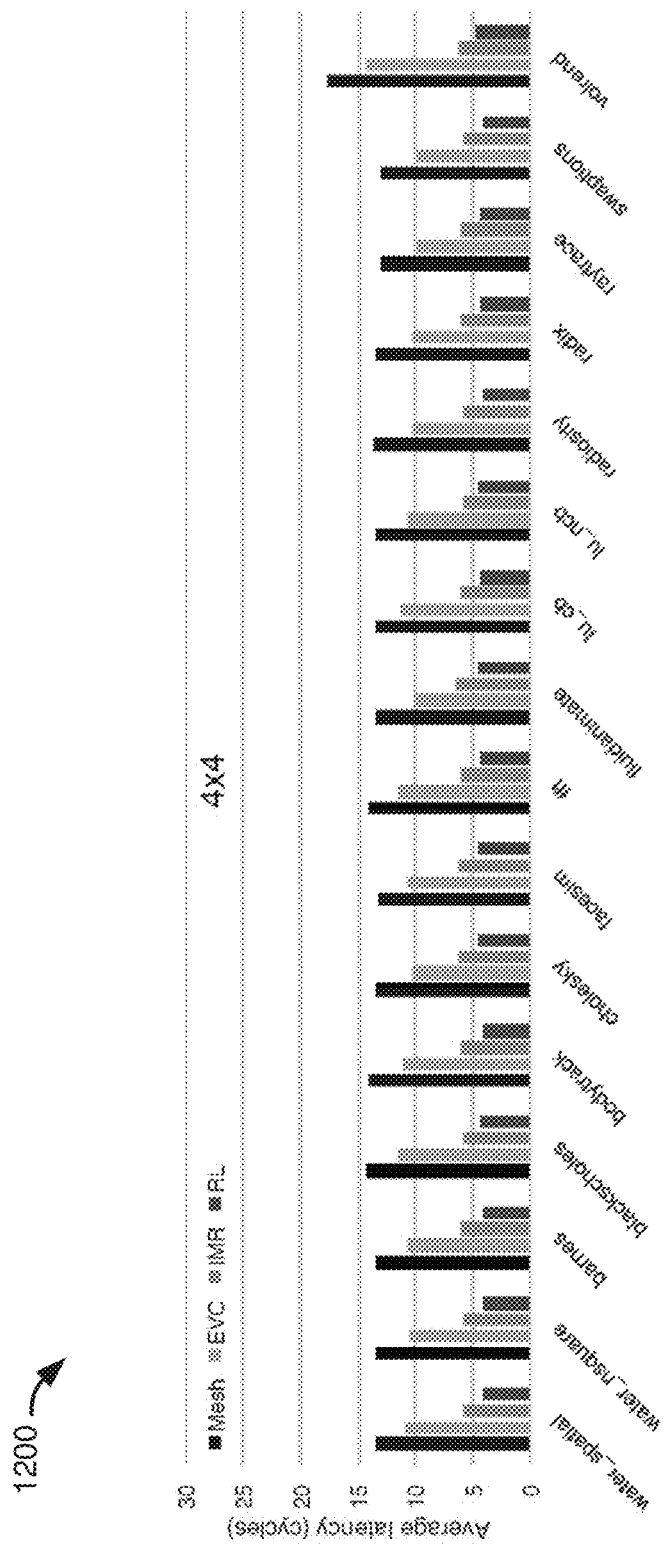
FIGS. 12A-C show plots illustrating the latency performance of the disclosed design techniques relative to other techniques using various benchmarks.
Figure 12B:
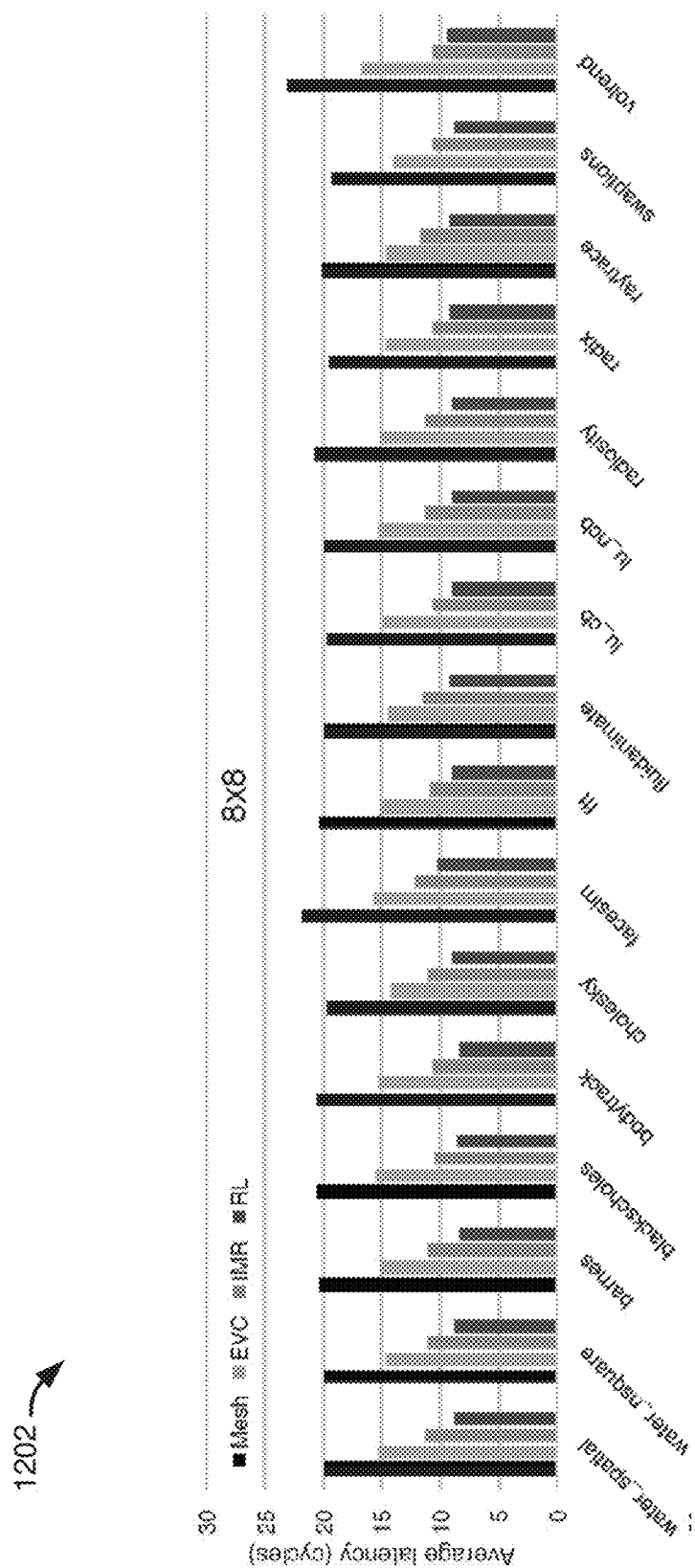
Figure 12C:
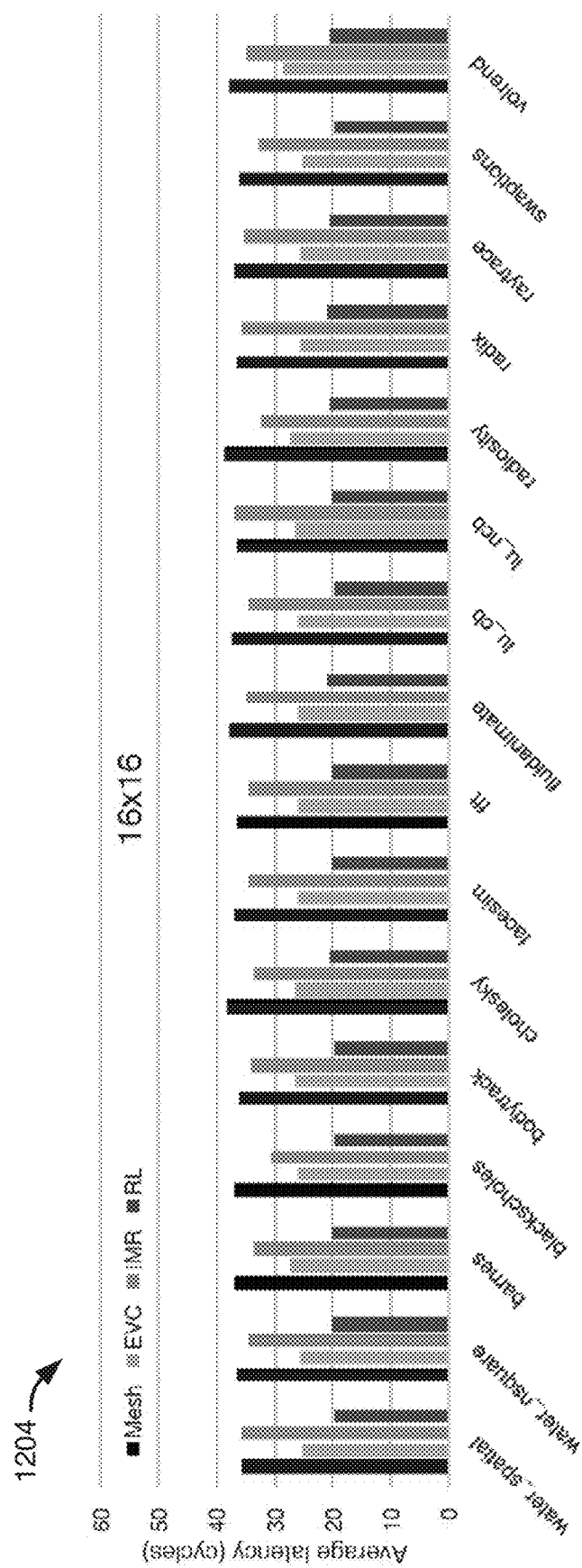

FIGS. 12A-C shows plots 1200, 1202, and 1204 of the PARSEC and SPLASH-2 benchmarks evaluated by Synfull for the RL, IMR, conventional mesh, and EVC designs. As shown by the plots 1200, 1202, 1204, the RL design provided better performance over all other NoCs in all topologies and all the benchmarks. For example, for a 16×16 topology, the average latency for the RL design was 20.1 flits/node/cycle, whereas the average latency for the mesh, EVC, and IMR designs was 37.01, 26.2, 34.2 flits/node/cycle, respectively. In general, the latency of the RL design was only 52%, 35%, and 34% of the latency of the mesh, EVC, and IMR designs, respectively. Further, the average number of cycles where both extension buffers were free is more than 99% of the total number of cycles. This gives the potential to neglect one of the extension buffer to further reduce the area of RL network interface.

C. Power and Area

To evaluate the power and area of the RL design, a Verilog version of an example RL interface as disclosed herein and shown in FIG. 8 was implemented, and the functionality of the interface was verified using extensive Modelsim simulations. For comparison, Verilog versions of other routers and interfaces were also implemented. For the mesh design, a parametrized RTL implementation provided by Hoskote et al., "A 5-GHz Mesh Interconnect for a Teraflops Processor," *IEEE Micro*, vol. 27, no. 5, pp. 51-61 (September-October 2007) was used. Additionally, Synopsys' Design Compiler and Cadence's Encounter tools were used for synthesis, and place and route was implemented using the NanGate FreePDK 15 Cell Library (see NanGate, Inc, "Nangate freePDK15 open cell library").

Figure 13:
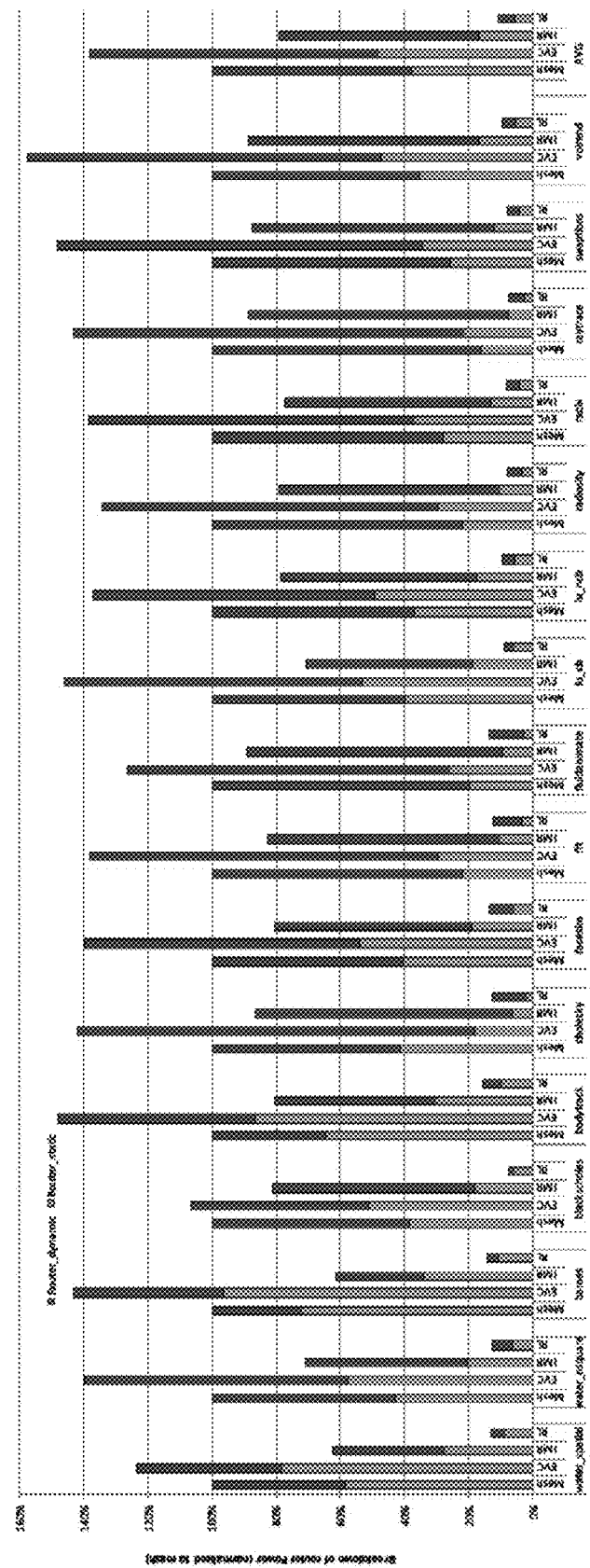
FIG. 13 show plots illustrating the power consumption of the disclosed design techniques relative to other techniques using various benchmarks.

FIG. 13 is a plot 1300 showing the breakdown of the routers' and interfaces' power consumption across the benchmarks and normalized to the mesh design. All power consumption shown in the plots is reported after place and route using the NanGate FreePDK 15 Cell Library by Cadence's Encounter. Activity factors for power measurements were obtained from the extensive simulation results. The power measurements were decomposed into dynamic power and static power. The dynamic power includes internal power and switching power. The internal power is consumed because of short circuit power while devices are changing their state. On the other hand, the switching power is consumed due to charging and discharging capacitive output loads. Compared to the mesh design, and on the average, the EVC design consumes 38% more power, and the IMR design has 20% lower power consumption. The RL design reduces the power consumption across the benchmarks by nearly 90%. This tremendous power saving is mainly due to the structure of the interface, which removes power hungry components, such as crossbars, and reduces the number of buffers.

The reported area for the mesh design was 45281 µm$^2$ and for EVC design was 60731 µm$^2$. The reported area for the IMR design was 20930 µm², and the area for the RL design was 6286 µm². All the reported areas are core area and they are reported by Cadence's Encounter after place and route using the NanGate FreePDK 15 Cell Library.

Figure 14:
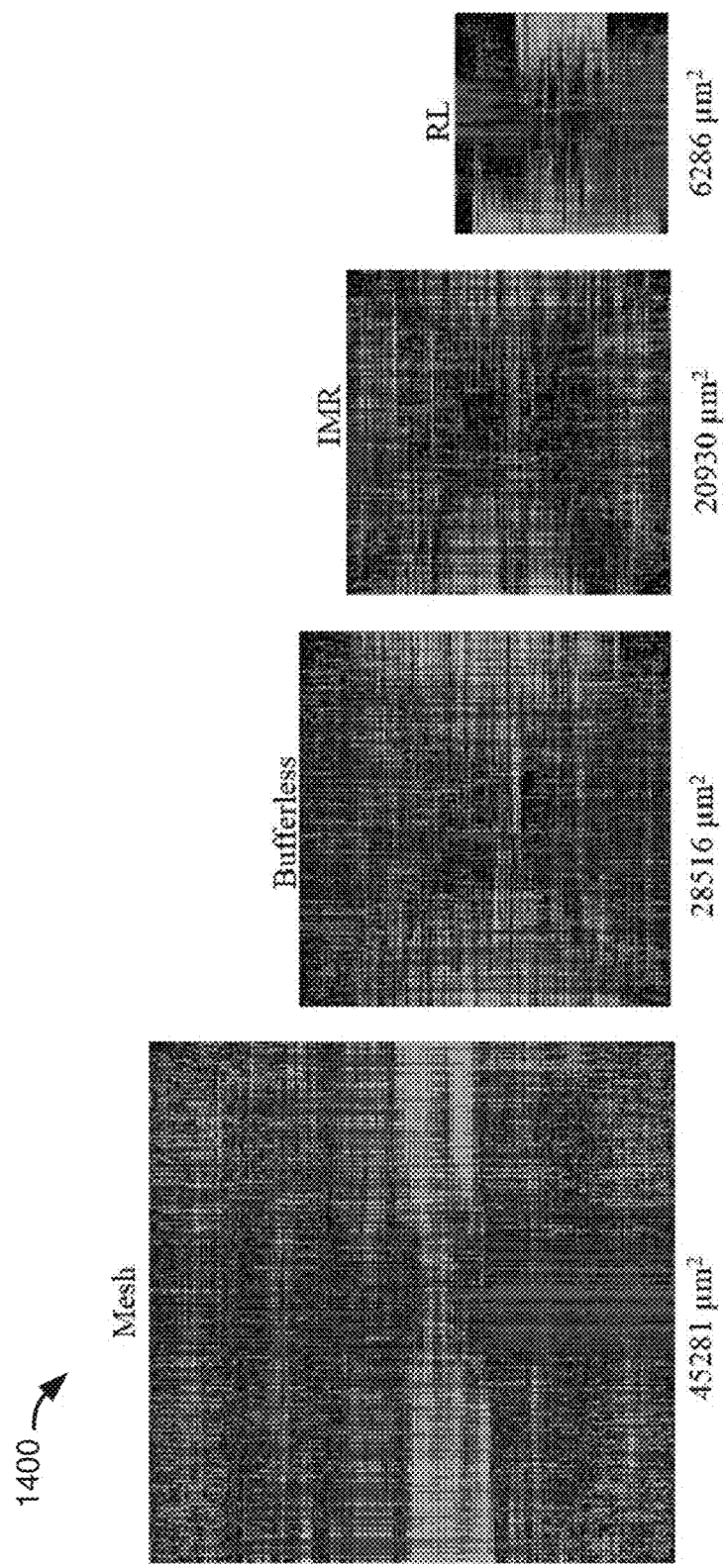
FIG. 14 is an image showing the layout and area differences of the routers and interfaces for the various tested designs.
Figure 15A:
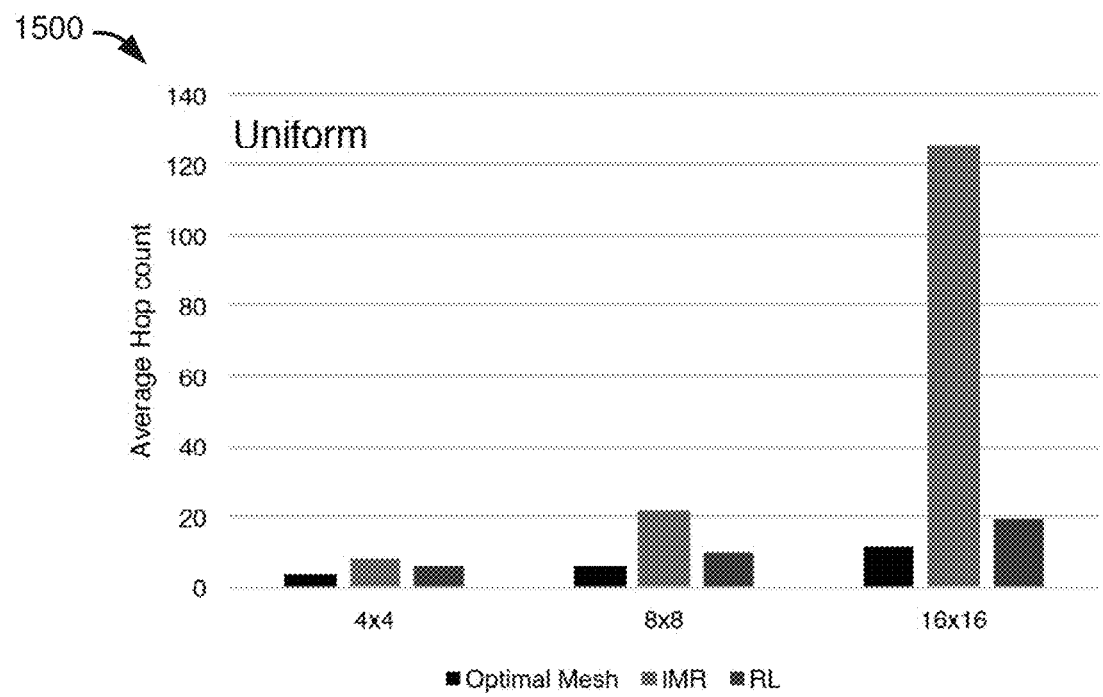
FIGS. 15A-D show plots illustrating the average hop count of the disclosed design techniques relative to other techniques for various mesh topologies.
Figure 15B:
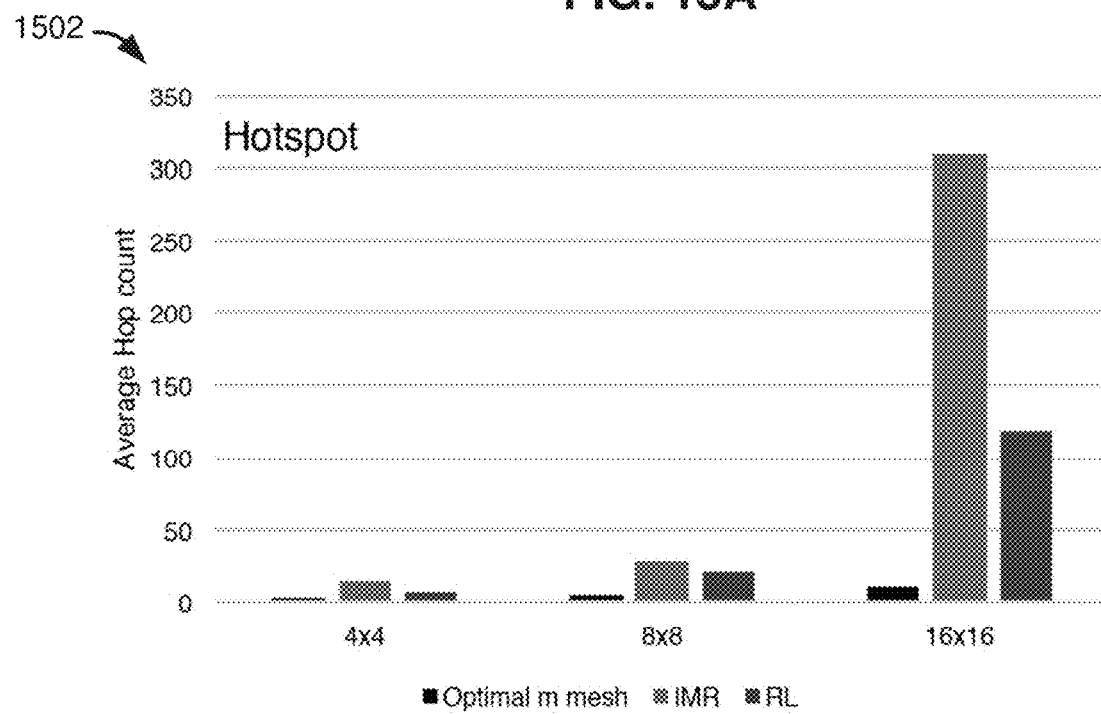
Figure 15C:
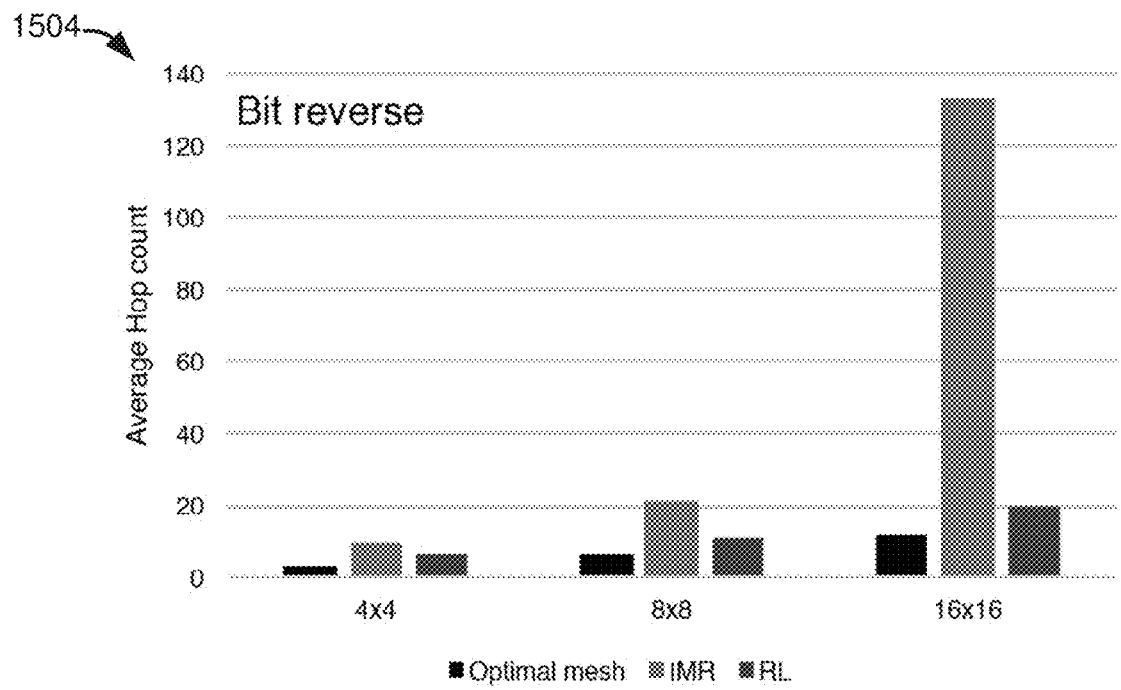
Figure 15D:
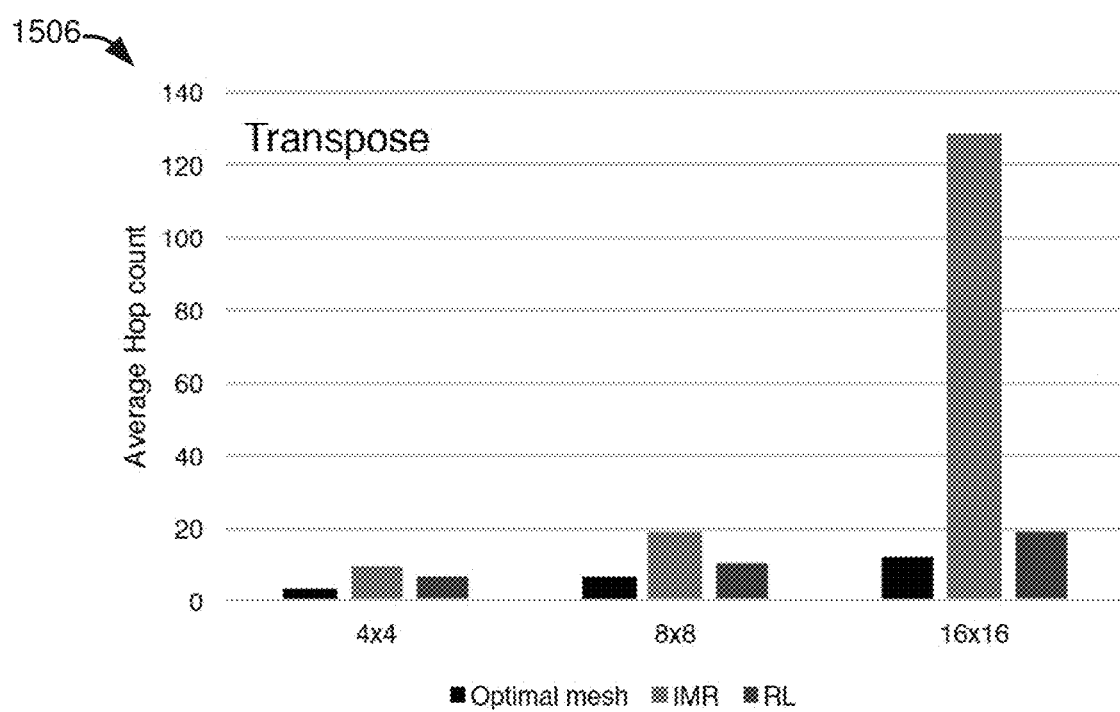

FIG. 14 is an image 1400 showing the layout of the routers and the interfaces for the various tested designs. The layouts were generated by Cadence's Encounter after place and route using the NanGate FreePDK 15 Cell Library. As shown in FIG. 14, the mesh design has a high area requirement when compared to the IMR interface and bufferless router. Using the IMR design, one can save about 53% while the bufferless router reduces the area by 37% in comparison with the mesh area. Furthermore, the RL interface can improve the area even more than bufferless. That is, the RL interface require less than 86% area than the mesh design. Therefore, the RL design allow to save a significant amount of silicon area for processing and storage units.

D. Additional Observations

The average hop count for synthetic traffic patterns was also evaluated. FIGS. 15A-D are plots 1500, 1502, 1504, 1506 showing the average hop count for the RL, IMR, and optimal Mesh designs for several traffic patterns. From these plots, it can be observed that the IMR design has a high average hop count because rings produced by their approach have a long length. Notably, the RL design has only a slightly higher average hop count than the optimal mesh.

NoCs will continue to accommodate more and more processing cores. Certain designs, for example, already propose 1000 cores. Therefore, scalability is vital for any NoC approach to help further support such high-core designs. As shown and described above, NoC designs in accordance with the disclosed technology are very effective in terms of latency and throughput for higher dimensional mesh topologies. Moreover, the power consumption and area occupancy exhibited by embodiments of the disclosed routerless network interfaces are extremely low when compared to conventional mesh routers or IMR designs, even for high mesh topologies.

VI. Overview of Example Embodiments

Figure 16:
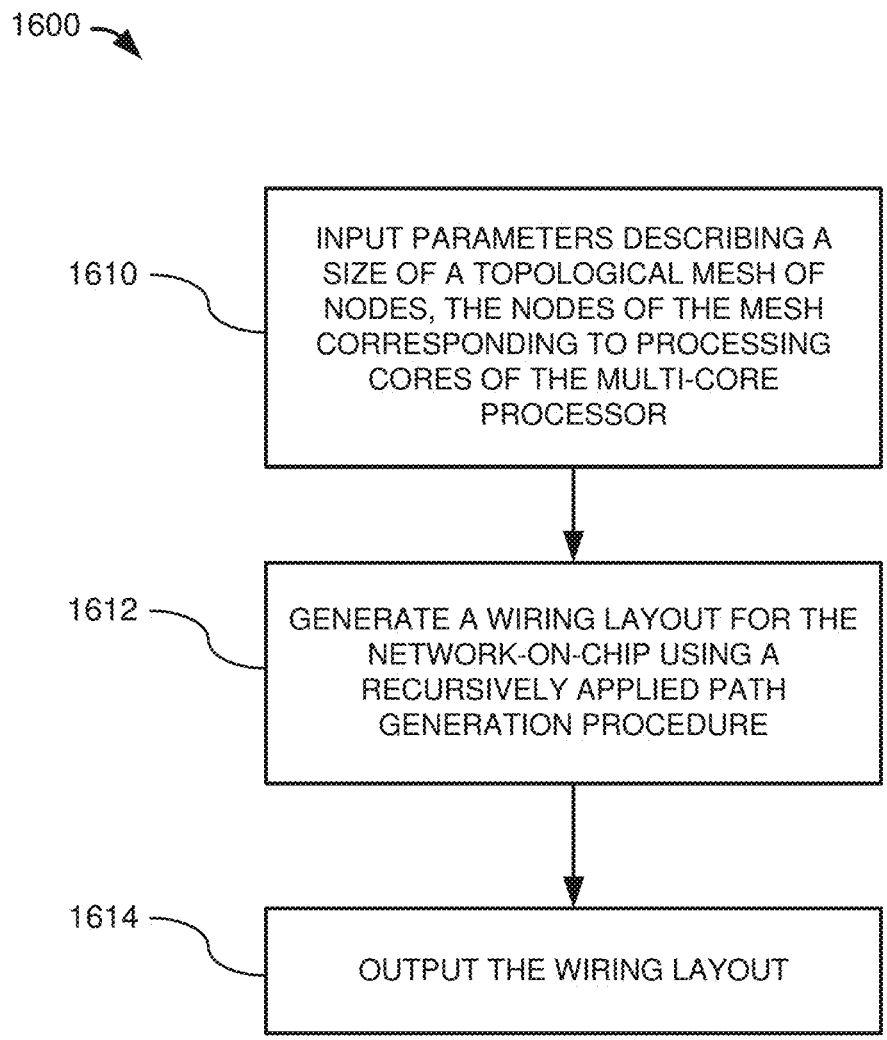
FIG. 16 is a flow chart showing a generalized example embodiment for implementing an NoC generation technique according to the disclosed technology.

FIG. 16 is a flow chart 1600 showing a generalized example embodiment for implementing an NoC generation technique according to the disclosed technology. The particular operations and sequence of operations should not be construed as limiting, as they can be performed alone or in any combination, subcombination, and/or sequence with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 16 can be performed, for example, by one or more specialized electronic design automation (EDA) tools that are adapted to perform the disclosed circuit design techniques (e.g., an EDA design tool for generating a hardware description of a network-on-chip configured to interconnect a plurality of processing cores of a multi-core processor). Such tool(s) can be used, for instance, as part of a circuit design and/or manufacturing process and be implemented by one or more computing devices as described above. The example embodiments described with respect to or related to FIG. 16 can be used to realize any one or more of the benefits disclosed herein.

At 1610, parameters that describe a size of a topological mesh of nodes are input (e.g., buffered into memory or otherwise prepared for further processing). In this embodiment, the nodes of the mesh correspond to processing cores of the multi-core processor.

At 1612, a wiring layout is generated for the network-on-chip by applying a path generation procedure that generates circular wiring paths connecting processing cores of a first layer of the topological mesh, and that is then recursively applied to generate circular wiring paths connecting processing cores for one or more additional layers of the topological mesh.

At 1614, the wiring layout is output (e.g., stored in an output file that can then be used by one or more downstream tools in the design and manufacturing flow of a multi-core processor). For instance, the wiring layout can be a hardware description, such as a hardware-design-language representation or a gate-level netlist.

In particular embodiments, the one or more additional layers of the topological mesh are concentric and interior to the first layer. In certain embodiments, the path generation procedure generates the circular wiring paths such that every pair of nodes of the topologic mesh share at least one circular wiring path. In some embodiments, the path generation procedure generates the circular wiring paths for a respective layer of the topological mesh in a deterministic fashion that minimizes hop count among the circular wiring paths.

Figure 17:
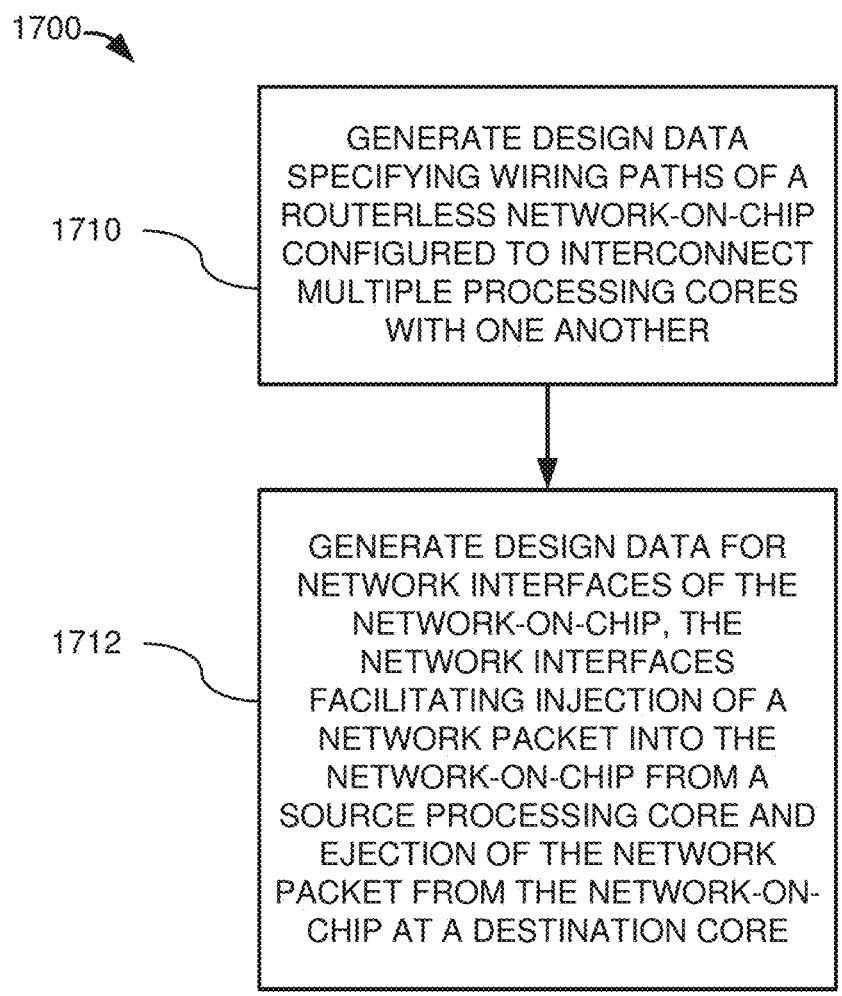
FIG. 17 is a flow chart showing another generalized example embodiment for implementing an NoC generation technique according to the disclosed technology.

FIG. 17 is a flow chart 1700 showing a generalized example embodiment for implementing an NoC generation technique according to the disclosed technology. The particular operations and sequence of operations should not be construed as limiting, as they can be performed alone or in any combination, subcombination, and/or sequence with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 17 can be performed, for example, by one or more specialized electronic design automation (EDA) tools that are adapted to perform the disclosed circuit design techniques (e.g., an EDA design tool for generating a hardware description of a network-on-chip configured to interconnect a plurality of processing cores of a multi-core processor). Such tool(s) can be used, for instance, as part of a circuit design and/or manufacturing process and be implemented by one or more computing devices as described above. The example embodiments described with respect to or related to FIG. 17 can be used to realize any one or more of the benefits disclosed herein.

At 1710, design data is generated specifying wiring paths of a routerless network-on-chip configured to interconnect the multiple processing cores with one another. In some embodiments, the wiring paths are generated using a deterministic wiring path selection procedure.

At 1712, design data is generated for network interfaces of the network-on-chip, the network interfaces facilitating injection of a network packet into the network-on-chip from a source processing core and ejection of the network packet from the network-on-chip at a destination core.

In particular embodiments, the one or more of the network interfaces comprise extension buffers that are shared among multiple input ports of the one or more network interfaces. In some embodiments, the wiring paths comprise a set of unidirectional wiring loops arranged so that every pair of processing cores shares at least one of the unidirectional wiring loops. In certain embodiments, the wiring paths have a rectangular shape.

Further disclosed embodiments comprise integrated circuits implementing any of the disclosed technologies. For instance, embodiments of the disclosed technology are chip multiprocessors (or multi-core processors). These particular embodiments should not be construed as limiting, as they can include any combination, subcombination, and/or combination of features as disclosed herein.

Particular embodiments include an integrated circuit, comprising: a plurality of processing cores; and a network-on-chip subsystem configured to interconnect the cores via a set of deterministically specified wiring circles. In certain embodiments, the network-on-chip subsystem is router-and-crossbar-free. In some embodiments, the plurality of cores are arranged in an n×n mesh topology having n columns and n rows, and the wiring circles include a first set of n−2 circles and a second set n−2 circles such that either a. every column other than the lowest and highest column is overlapped by only two circles of the first set and the second set; or b. every row other than the lowest and highest row is overlapped by only two circles of the first set and the second set. In certain embodiments, the plurality of cores are arranged in an m×n mesh topology having m columns and n rows, and the wiring circles include a first set of circles that includes: (a) all nodes of the lowest column along a first side of the circles and all nodes from respective incrementally higher columns along a second side of the circles except for the highest column; (b) all nodes of the highest column along a first side of the circles and all nodes from respective incrementally lower columns along a second side of the circles except for the lowest column; b. all nodes of the lowest row along a first side of the circles and all nodes from respective incrementally higher rows along a second side of the circles except for the highest row; or c. all nodes of the highest row along a first side of the circles and all nodes from respective incrementally lower rows along a second side of the circles except for the lowest row. In certain embodiments, the plurality of cores are arranged in an m×n mesh topology having m columns and n rows, the wiring circles include a perimeter circle the includes all perimeter nodes of the mesh topology and is configured to propagate network data in a first direction, and the wiring circles include a plurality of interior circles that at least partially include nodes that are interior of the perimeter node and that are configured to propagate network data in a second direction opposite of the first direction. In some embodiments, the wiring circles further include a sub-layer perimeter circle that is concentric to the perimeter circle and that includes all nodes along a perimeter of a layer of the mesh topology that is interior to perimeter circle, and wherein the wiring circles include a plurality of sub-layer interior circles that are interior of the perimeter circle and that at least partially include nodes that are interior of the sub-layer perimeter circle. In certain embodiments, the network-on-chip subsystem further comprises a network interface configured to implement a deadlock-free protocol for injecting and ejecting flow control units to and from the network interface. In some embodiments, the network-on-chip subsystem further comprises a network interface for a respective core of the integrated circuit, the respective core having network access to a plurality of wiring circles connected to the network interface, the network interface further comprising an extension buffer that is shared among the plurality of wiring circles. In certain embodiments, the network-on-chip subsystem further comprises a network interface comprising one or more extension buffers configured to receive network packets from a neighboring core as packets are being simultaneously received by an injection port and output from an ejection port of the network interface.

VII. Example Computing Environments

Figure 18:
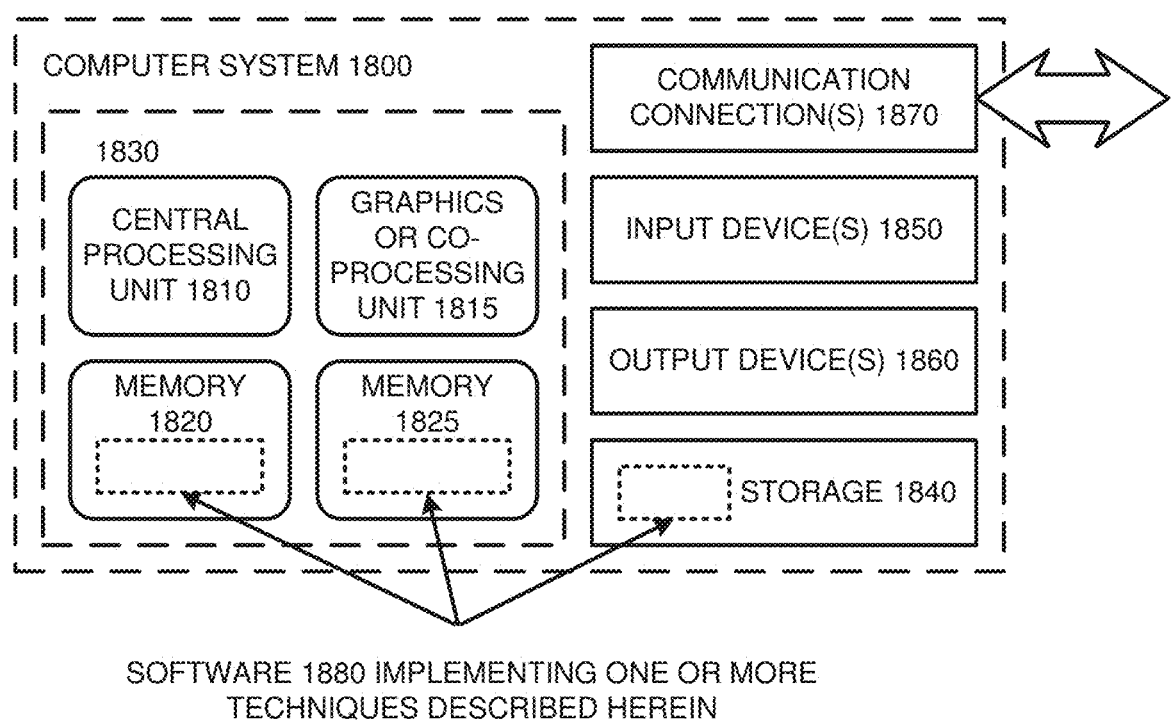
FIG. 18 illustrates a generalized example of a suitable computer system in which the described innovations may be implemented.

FIG. 18 illustrates a generalized example of a suitable computer system 1800 in which the described innovations may be implemented. The example computer system 1800 can be a server or computer workstation (e.g., PC, laptop, tablet computer, mobile device, or the like) used by a design engineer during the design and production of a many-core processor.

With reference to FIG. 18, the computer system 1800 includes one or more processing devices 1810, 1815 and memory 1820, 1825. The processing devices 1810, 1815 execute computer-executable instructions. A processing device can be a general-purpose CPU, GPU, processor in an ASIC, FPGA, or any other type of processor. In a multi-processing system, multiple processing units execute computer-executable instructions to increase processing power. For example, FIG. 18 shows a CPU 1810 as well as a GPU or co-processing unit 1815. The tangible memory 1820, 1825) may be volatile memory (e.g., registers, cache, RAM), non-volatile memory (e.g., ROM, EEPROM, flash memory, NVRAM, etc.), or some combination of the two, accessible by the processing device(s). The memory 1820, 1825 stores software 1880 implementing one or more innovations described herein, in the form of computer-executable instructions suitable for execution by the processing device(s). The software 1880 can be, for example, an electronic design automation ("EDA") design tool. For instance, the EDA tool can be a behavioral synthesis tool configured to generate an HDL description of any of the disclosed NoCs or components (e.g., a Verilog, SystemVerilog, or VHDL description), a logic synthesis and/or place-and-route tool configured to generate a gate-level netlist (e.g., from an HDL description) for any of the of the disclosed NoCs or components, a physical synthesis tool configured to generate a geometric layout (e.g., a GDSII or Oasis file) that can be used to make a mask-level model form which masks can be printed and the final integrated circuit fabricated. The software 1880 can also comprise other suitable EDA tools for implementing the disclosed technology.

The computer system 1800 may have additional features. For example, the computer system 1800 includes storage 1840, one or more input devices 1850, one or more output devices 1860, and one or more communication connections 1870. An interconnection mechanism (not shown) such as a bus, controller, or network interconnects the components of the computer system 1800. Typically, operating system software (not shown) provides an operating environment for other software executing in the computer system 1800, and coordinates activities of the components of the computer system 1800.

The tangible storage 1840 may be removable or non-removable, and includes magnetic disks, magnetic tapes or cassettes, optical storage media such as CD-ROMs or DVDs, or any other medium which can be used to store information and which can be accessed within the computer system 1800. The storage 1840 stores instructions for the software 1880 implementing one or more innovations described herein.

The input device(s) 1850 may be a touch input device such as a keyboard, mouse, pen, or trackball, a voice input device, a scanning device, or another device that provides input to the computer system 1800. For video or image input, the input device(s) 1850 may be a camera, video card, TV tuner card, screen capture module, or similar device that accepts video input in analog or digital form, or a CD-ROM or CD-RW that reads video input into the computer system 1800. The output device(s) 1860 include a display device. The output device(s) may also include a printer, speaker, CD-writer, or another device that provides output from the computer system 1800.

The communication connection(s) 1870 enable communication over a communication medium to another computing entity. For example, the communication connection(s) 1870 can connect the computer system 1800 to the internet and provide the functionality described herein. The communication medium conveys information such as computer-executable instructions, audio or video input or output, image data, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations presented herein can be described in the general context of computer-readable media. Computer-readable media are any available tangible media that can be accessed within a computing environment. By way of example, and not limitation, with the computer system 1800, computer-readable media include memory 1820, 1825, storage 1840, and combinations of any of the above. As used herein, the term computer-readable media does not cover, encompass, or otherwise include carrier waves or signals per se.

The innovations can be described in the general context of computer-executable instructions, such as those included in program modules, being executed in a computer system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computer system.

The terms "system" and "device" are used interchangeably herein. Unless the context clearly indicates otherwise, neither term implies any limitation on a type of computer system or computer device. In general, a computer system or computer device can be local or distributed, and can include any combination of special-purpose hardware and/or general-purpose hardware with software implementing the functionality described herein.

The disclosed methods can also be implemented using specialized computing hardware configured to perform any of the disclosed methods. For example, the disclosed methods can be implemented by an integrated circuit (e.g., an ASIC such as an ASIC digital signal processor ("DSP"), a GPU, or a programmable logic device ("PLD") such as a field programmable gate array ("FPGA")) specially designed or configured to implement any of the disclosed methods.

VIII. Concluding Remarks

In view of the many possible embodiments to which the principles of the disclosed invention may be applied, it should be recognized that the illustrated embodiments are only preferred examples of the invention and should not be taken as limiting the scope of the invention.

What is claimed is:

1. A computer-implemented method, comprising:
   by a processor implementing an electronic design automation (EDA) design tool, generating a hardware description of a network-on-chip configured to interconnect a plurality of processing cores of a multi-core processor via routerless wiring paths, wherein the generating comprises:
      inputting parameters describing a size of a topological mesh of nodes, the nodes of the mesh corresponding to processing cores of the multi-core processor;
      generating a wiring layout for the network-on-chip by applying a path generation procedure that generates circular wiring paths connecting processing cores of a first layer of the topological mesh and recursively applying the path generation procedure to generate circular wiring paths connecting processing cores for one or more additional layers of the topological mesh; and
      outputting the wiring layout.

2. The method of claim 1, wherein the one or more additional layers of the topological mesh are concentric and interior to the first layer.

3. The method of claim 1, wherein the path generation procedure generates the circular wiring paths such that every pair of nodes of the topologic mesh share at least one circular wiring path.

4. The method of claim 1, wherein the path generation procedure generates the circular wiring paths for a respective layer of the topological mesh in a deterministic fashion that minimizes hop count among the circular wiring paths.

5. The method of claim 1, wherein the hardware description is a hardware-design-language representation or a gate-level netlist.

6. One or more memory or storage devices storing computer-executable instructions which when executed cause the computer to perform the method of claim 1.

7. A system, comprising:
   a memory or storage device; and
   one or more processors, the one or more processors being configured to implement an electronic design automation (EDA) tool for generating an integrated circuit design comprising multiple processing cores;
      generating design data specifying wiring paths of a routerless network-on-chip configured to interconnect the multiple processing cores with one another; and
      generating design data for network interfaces of the network-on-chip, the network interfaces facilitating injection of a network packet into the network-on-chip from a source processing core and ejection of the network packet from the network-on-chip at a destination core.

8. The system of claim 7, wherein one or more of the network interfaces comprise extension buffers that are shared among multiple input ports of the one or more network interfaces.

9. The system of claim 7, wherein the wiring paths comprise a set of unidirectional wiring loops arranged so that every pair of processing cores shares at least one of the unidirectional wiring loops.

10. The system of claim 7, wherein the generating comprises applying a deterministic wring path selection procedure.

11. The system of claim 7, wherein the wiring paths all have a rectangular shape.

\* \* \* \* \*